(12) United States Patent
El-Ghoroury et al.

(10) Patent No.: US 11,335,829 B2
(45) Date of Patent: *May 17, 2022

(54) MULTI-COLOR LIGHT EMITTING STRUCTURES WITH CONTROLLABLE EMISSION COLOR

(71) Applicant: Ostendo Technologies, Inc., Carlsbad, CA (US)

(72) Inventors: Hussein S. El-Ghoroury, Carlsbad, CA (US); Mikhail V. Kisin, Carlsbad, CA (US); Yea-Chuan Milton Yeh, Santa Monica, CA (US); Chih-Li Chuang, San Diego, CA (US); Jyh-Chia Chen, Yorba Linda, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/523,825

(22) Filed: Nov. 10, 2021

(65) Prior Publication Data

US 2022/0123169 A1    Apr. 21, 2022

Related U.S. Application Data

(60) Continuation of application No. 17/373,659, filed on Jul. 12, 2021, which is a division of application No. (Continued)

(51) Int. Cl.
*H01S 5/34* (2006.01)
*H01L 33/08* (2010.01)
(Continued)

(52) U.S. Cl.
CPC ............. *H01L 33/08* (2013.01); *H01L 33/06* (2013.01); *H01L 33/32* (2013.01); *H01S 5/0421* (2013.01);
(Continued)

(58) Field of Classification Search
CPC .... H01S 5/2009; H01S 5/2013; H01S 5/3407; H01S 5/3446; H01S 5/1092; H01S 5/1096; H01S 5/18397
See application file for complete search history.

(56) References Cited

U.S. PATENT DOCUMENTS 4,839,899 A    6/1989    Burnham et al.
5,386,428 A    1/1995    Thornton et al.
(Continued)

FOREIGN PATENT DOCUMENTS

CN    1120254 A    4/1996
CN    1484880 A    3/2004
(Continued)

OTHER PUBLICATIONS

Hong, Y.J., et al., "Visible-Color-Tunable Light Emitting Diodes," Advanced Materials, vol. 23, No. 9 (2011), pp. 3284-3288.
(Continued)

*Primary Examiner* — Tod T Van Roy
(74) *Attorney, Agent, or Firm* — Greg Caldwell, Esq.; W. Eric Boyd, Esq.

(57) ABSTRACT

Disclosed herein are multi-layered optically active regions for semiconductor light-emitting devices (LEDs) that incorporate intermediate carrier blocking layers, the intermediate carrier blocking layers having design parameters for compositions and doping levels selected to provide efficient control over the carrier injection distribution across the active regions to achieve desired device injection characteristics. Examples of embodiments discussed herein include, among others: a multiple-quantum-well variable-color LED operating in visible optical range with full coverage of RGB gamut, a multiple-quantum-well variable-color LED operating in visible optical range with an extended color gamut beyond standard RGB gamut, a multiple-quantum-well light-white emitting LED with variable color temperature,
(Continued)

and a multiple-quantum-well LED with uniformly populated active layers.

10 Claims, 18 Drawing Sheets

Related U.S. Application Data

15/173,485, filed on Jun. 3, 2016, now Pat. No. 11,063,179.

(60) Provisional application No. 62/290,607, filed on Feb. 3, 2016, provisional application No. 62/275,650, filed on Jan. 6, 2016, provisional application No. 62/171,536, filed on Jun. 5, 2015.

(51) Int. Cl.
| | |
|---|---|
| H01L 33/06 | (2010.01) |
| H01L 33/32 | (2010.01) |
| H01S 5/042 | (2006.01) |
| H01S 5/343 | (2006.01) |
| H01S 5/062 | (2006.01) |
| H01S 5/20 | (2006.01) |
| H01S 5/40 | (2006.01) |
| H01S 5/10 | (2021.01) |

(52) U.S. Cl.
CPC ........ *H01S 5/0622* (2013.01); *H01S 5/34333* (2013.01); *H01S 5/1096* (2013.01); *H01S 5/2009* (2013.01); *H01S 5/3407* (2013.01); *H01S 5/4043* (2013.01); *H01S 5/4093* (2013.01)

(56) References Cited

U.S. PATENT DOCUMENTS

| | | | |
|---|---|---|---|
| 5,422,898 | A | 6/1995 | Kash et al. |
| 5,737,353 | A | 4/1998 | Sasaki |
| 5,851,905 | A | 12/1998 | McIntosh et al. |
| 5,929,462 | A | 7/1999 | Kasukawa et al. |
| 6,229,152 | B1 | 5/2001 | Dries et al. |
| 6,434,178 | B1 | 8/2002 | Ubukata |
| 6,469,358 | B1 | 10/2002 | Martin |
| 6,858,869 | B2 | 2/2005 | Fujiwara |
| 6,919,584 | B2 | 7/2005 | Wang et al. |
| 7,058,105 | B2 | 6/2006 | Lee et al. |
| 7,084,436 | B2 | 8/2006 | DenBaars et al. |
| 7,323,721 | B2 | 1/2008 | Liao et al. |
| 7,623,560 | B2 | 11/2009 | El-Ghoroury et al. |
| 7,767,479 | B2 | 8/2010 | El-Ghoroury et al. |
| 7,829,902 | B2 | 11/2010 | El-Ghoroury et al. |
| 7,902,545 | B2 | 3/2011 | Csutak |
| 8,049,231 | B2 | 11/2011 | El-Ghoroury et al. |
| 8,098,265 | B2 | 1/2012 | El-Ghoroury et al. |
| 8,243,770 | B2 | 8/2012 | El-Ghoroury et al. |
| 8,314,429 | B1 | 11/2012 | Raring et al. |
| 8,451,877 | B1 | 5/2013 | Crawford et al. |
| 8,455,917 | B2 | 6/2013 | Nago et al. |
| 8,567,960 | B2 | 10/2013 | El-Ghoroury et al. |
| 9,847,444 | B2 | 12/2017 | Suga et al. |
| 9,985,174 | B2 | 5/2018 | El-Ghoroury et al. |
| 10,396,240 | B2 | 8/2019 | Veh et al. |
| 10,418,516 | B2 | 9/2019 | El-Ghoroury et al. |
| 11,063,179 | B2 | 7/2021 | El-Ghoroury et al. |
| 2003/0218180 | A1 | 11/2003 | Fujiwara |
| 2004/0051107 | A1 | 3/2004 | Nagahama et al. |
| 2004/0125839 | A1 | 7/2004 | Lee et al. |
| 2004/0161006 | A1 | 8/2004 | Chang et al. |
| 2004/0183088 | A1 | 9/2004 | Denbaars et al. |
| 2004/0256626 | A1 | 12/2004 | Wang et al. |
| 2005/0145857 | A1 | 7/2005 | Maruyama et al. |
| 2006/0049415 | A1 | 3/2006 | Liao et al. |
| 2007/0183469 | A1 | 8/2007 | Ryu |
| 2007/0241676 | A1 | 10/2007 | Park et al. |
| 2007/0286250 | A1 | 12/2007 | Lei et al. |
| 2007/0291808 | A1 | 12/2007 | Ledentsov et al. |
| 2008/0124827 | A1 | 5/2008 | Huang et al. |
| 2008/0149917 | A1 | 6/2008 | Park |
| 2008/0247435 | A1 | 10/2008 | Choi |
| 2008/0273566 | A1 | 11/2008 | Nishinaka et al. |
| 2009/0045392 | A1 | 2/2009 | Park et al. |
| 2009/0086170 | A1 | 4/2009 | El-Ghoroury et al. |
| 2009/0179191 | A1 | 7/2009 | Smith et al. |
| 2009/0191427 | A1 | 7/2009 | Liao et al. |
| 2009/0250686 | A1 | 10/2009 | Sato et al. |
| 2009/0278998 | A1 | 11/2009 | El-Ghoroury et al. |
| 2010/0003777 | A1 | 1/2010 | El-Ghoroury et al. |
| 2010/0006873 | A1 | 1/2010 | Raring et al. |
| 2010/0066921 | A1 | 3/2010 | El-Ghoroury et al. |
| 2010/0158064 | A1 | 6/2010 | Takahashi et al. |
| 2010/0181583 | A1 | 7/2010 | Peter et al. |
| 2010/0189148 | A1 | 7/2010 | Kyono et al. |
| 2010/0220042 | A1 | 9/2010 | El-Ghoroury et al. |
| 2010/0301319 | A1 | 12/2010 | Kuma et al. |
| 2011/0095291 | A1 | 4/2011 | Quitoriano |
| 2011/0186823 | A1 | 8/2011 | Yen et al. |
| 2011/0188528 | A1 | 8/2011 | Kisin et al. |
| 2011/0237011 | A1 | 9/2011 | Zhang et al. |
| 2012/0008660 | A1 | 1/2012 | Fujii et al. |
| 2012/0033113 | A1 | 2/2012 | El-Ghoroury et al. |
| 2012/0049157 | A1 | 3/2012 | Nago et al. |
| 2012/0295422 | A1 | 11/2012 | Jiang et al. |
| 2012/0313076 | A1 | 12/2012 | Nakamura et al. |
| 2013/0056785 | A1 | 3/2013 | Hwang |
| 2013/0075696 | A1 | 3/2013 | Hsieh et al. |
| 2013/0082238 | A1 | 4/2013 | Hsieh et al. |
| 2013/0243024 | A1 | 9/2013 | Hara |
| 2013/0250986 | A1 | 9/2013 | Wunderer et al. |
| 2013/0334493 | A1 | 12/2013 | Luo |
| 2014/0103290 | A1 | 4/2014 | Yen et al. |
| 2014/0166978 | A1 | 6/2014 | Shioda et al. |
| 2014/0175440 | A1 | 6/2014 | Mohammed et al. |
| 2015/0213747 | A1 | 7/2015 | Adamovich et al. |
| 2015/0228932 | A1 | 8/2015 | Ma et al. |
| 2015/0255669 | A1 | 9/2015 | Han et al. |
| 2016/0027961 | A1 | 1/2016 | Mi et al. |
| 2016/0359084 | A1 | 12/2016 | El-Ghoroury et al. |
| 2016/0359086 | A1 | 12/2016 | El-Ghoroury et al. |
| 2016/0359299 | A1 | 12/2016 | El-Ghoroury et al. |
| 2016/0359300 | A1 | 12/2016 | El-Ghoroury et al. |

FOREIGN PATENT DOCUMENTS

| | | |
|---|---|---|
| CN | 1790756 A | 6/2006 |
| CN | 103311805 A | 9/2013 |
| CN | 107851968 A | 3/2018 |
| CN | 108292693 A | 7/2018 |
| EP | 2610927 A2 | 7/2013 |
| JP | 2002176198 A | 6/2002 |
| JP | 2004087763 A | 3/2004 |
| JP | 2007019455 A | 1/2007 |
| JP | 2008311658 A | 12/2008 |
| JP | 2009170921 A | 7/2009 |
| JP | 2009224370 A | 10/2009 |
| JP | 4412918 B2 * | 2/2010 |
| JP | 2011517098 A | 5/2011 |
| JP | 2013219323 A | 10/2013 |
| JP | 2018516466 A | 6/2018 |
| JP | 2021122059 A | 8/2021 |
| KR | 10-2013-0028291 * | 3/2013 |
| KR | 1020130028291 A | 3/2013 |
| KR | 20180015163 A | 2/2018 |
| KR | 20180067590 A | 6/2018 |
| TW | 201421727 A | 6/2014 |
| TW | 201724553 A | 7/2017 |
| TW | 201735390 A | 10/2017 |
| WO | 0058999 B1 | 8/2001 |

(56) References Cited

FOREIGN PATENT DOCUMENTS

| | | |
|---|---|---|
| WO | 2016197062 A1 | 12/2016 |
| WO | 2017062889 A1 | 4/2017 |

OTHER PUBLICATIONS

Hwang, Jong-Il, et. al., "Development of InGaN-based red LED grown on (0001) polar surface," Applied Physics Express, vol. 7, (2014), pp. 071003-1 to 071003-4.

International Preliminary Report on Patentability for International Patent Application No. PCT/US2016/035913, dated Dec. 14, 2017, 13 pages.

International Search Report and Written Opinion for International Patent Application No. PCT/US2016/035913, dated Sep. 30, 2016, 16 pages.

International Search Report and Written Opinion for International Patent Application No. PCT/US2016/056157, dated Nov. 29, 2016, 12 pages.

Kim, Min-Ho, et al., "Origin of efficiency droop in GaN-based light-emitting diodes," Applied Physics Letters, vol. 91, No. 18 (2007), pp. 183507-1 to 183507-3.

Kisin, M.V., et al., "Inhomogeneous injection in III-nitride light emitters with deep multiple quantum wells," Journal of Computational Electronics, vol. 14, No. 2 (2015), pp. 432-443.

Kisin, M.V., et al., "Modeling of III-Nitride Multiple-Quantum-Well Light-Emitting Structures," IEEE Journal of Selected Topics in Quantum Electronics, vol. 19, No. 5 (2013), pp. 1-10.

Kisin, M.V., et al., "Non-equilibrium quantum well populations and active region inhomogeneity in polar and nonpolar III-nitride light emitters," Journal of Applied Physics, vol. 111 (2012), pp. 103113-1 to 103113-9.

Laubsch, A., et al., "On the origin of IQE-'droop' in InGaN LEDs," Physica Status Solidi C., vol. 6, No. 52 (2009), pp. S913-S916.

Li, X., et al., "The effects of thin capping layers between quantum wells and barriers on the quantum efficiency enhancement in InGaN-based light emitting diodes," Applied Physics Letters, vol. 103 (2013) pp. 111103-1 to 111103-4.

Mukai, T., et al., "Characteristics of InGaN-Based UV/Blue/Green/Amber/Red Light-Emitting Diodes," Jpn Journal of Applied Physics, vol. 38, Part 1, No. 7A (Jul. 1999), pp. 3976-3981.

Nakamura, S., et al.," Candela-class high-brightness InGaN/AlGaN double-heterostructure blue-light-emitting-diodes," Applied Physics Letters, vol. 64, No. 13 (Mar. 28, 1994), pp. 1687-1689.

Nakamura, S., et al., "High-brightness InGaN/AlGaN double-heterostructure blue-green-light-emitting diodes," Journal of Applied Physics, vol. 76, No. 12 (Dec. 15, 1994), pp. 8189-8191.

Nakamura, S., et al., "Ridge-geometry InGaN multi-quantum-well-structure laser diodes," Applied Physics Letters, vol. 69, No. 10 (Sep. 2, 1996), pp. 1477-1479.

Non-Final Office Action for U.S. Appl. No. 15/173,485, dated Feb. 16, 2017, 10 pages.

Non-Final Office Action for U.S. Appl. No. 15/173,485, dated Jan. 9, 2018, 12 pages.

Non-Final Office Action for U.S. Appl. No. 15/173,485, dated Jul. 25, 2019, 20 pages.

Non-Final Office Action for U.S. Appl. No. 15/173,500, dated Feb. 16, 2017, 11 pages.

Non-Final Office Action for U.S. Appl. No. 15/173,500, dated Nov. 13, 2019, 21 pages.

Non-Final Office Action for U.S. Appl. No. 15/173,500, dated Feb. 15, 2018, 13 pages.

Non-Final Office Action for U.S. Appl. No. 15/173,511, dated Nov. 17, 2016, 11 pages.

Non-Final Office Action for U.S. Appl. No. 15/173,511, dated Jun. 1, 2017, 12 pages.

Non-Final Office Action for U.S. Appl. No. 15/173,517, dated Nov. 2, 2016, 17 pages.

Non-Final Office Action for U.S. Appl. No. 15/173,517, dated Mar. 9, 2018, 17 pages.

Non-Final Office Action for U.S. Appl. No. 15/173,517, dated Nov. 1, 2019, 24 pages.

Non-Final Office Action for U.S. Appl. No. 15/287,384, dated Sep. 20, 2017, 21 pages.

Non-Final Office Action for U.S. Appl. No. 15/990,494, dated Oct. 11, 2018, 17 pages.

Non-Final Office Action for U.S. Appl. No. 17/373,659, dated Oct. 7, 2021, 8 pages.

Notice of Allowance for U.S. Appl. No. 15/173,485, dated Mar. 10, 2021, 8 pages.

Notice of Allowance for U.S. Appl. No. 15/173,511, dated Mar. 26, 2018, 11 pages.

Notice of Allowance for U.S. Appl. No. 15/287,384, dated Apr. 10, 2019, 8 pages.

Notice of Allowance for U.S. Appl. No. 15/990,494, dated May 7, 2019, 11 pages.

Notice of Intent to Grant European Patent Application No. 16784685.6, dated Apr. 19, 2021, 28 pages.

Notice of Intent to Grant for Chinese Patent Application No. 201680072137.5, dated Jul. 14, 2021, 2 pages.

Notice of Reasons for Refusal for Japan Patent Application No. 2017-563220, dated Jun. 9, 2020, 8 pages.

Office Action for Taiwan Patent Application No. 105117772, dated Jun. 11, 2019, 11 pages.

Office Action for Taiwan Patent Application No. 105117772, dated Oct. 21, 2020, 2 pages.

Office Action for Taiwan Patent Application No. 105132658, dated May 24, 2021, 7 pages.

Sang, L., et al, "A Comprehensive Review of Semiconductor Ultraviolet Photodetectors: From Thin Film to One-Dimensional Nanostructures," Sensors, vol. 13, No. 8, Jan. 1, 2013, pp. 10482-10515.

Schubert, E.F., "Light-Emitting Diodes," Cambridge University Press (2003), pp. 1-16.

Second Office Action for Chinese Patent Application No. 201680072137.5, dated Jan. 19, 2021, 23 pages Sekiguchi, H., et al., "Emission color control from blue to red with nanocolumn diameter of InGaN/GaN nanocolumn arrays grown on same substrate," Applied Physics Letters, vol. 96 (2010), pp. 231104-1 to 231104-3

Shatalov, M., et al., "High power AlGaN ultraviolet light emitters," Semiconductor Science and Technology, vol. 29, 084007 (2014), pp. 1-6.

Stevenson, Dr. Richard, "Viewpoint-Full colour GaN," Compound Semiconductor, vol. 22, Issue 8 (Nov./Dec. 2016), p. 3.

Strittmatter, A., et al., "Semi-polar nitride surfaces and heterostructures," Physica Status Solidi B, vol. 248, No. 3 (2011), pp. 561-573.

Suchalkin, S., et al., "Mechanism of the temperature sensitivity of mid-infrared GaSb-based semiconductor lasers," Applied Physics Letters, vol. 87, No. 4 (2005), pp. 041102-1 to 041102-3.

Sze, S.M., et al., "Physics of Semiconductor Devices," John Wiley & Sons, 3rd Edition (2006), pp. 13-14, 24.

Tessler, N., et al., "Distributed nature of quantum-well lasers," Applied Physics Letters, vol. 62, No. 1 (Jan. 4, 1993), pp. 10-12.

Verrzellesi, G., et al., "Efficiency droop in InGaN/GaN blue light-emitting diodes: Physical mechanisms and remedies," Journal of Applied Physics, vol. 114, No. 7 (2013) pp. 071101-1 to 071101-14.

Vurgaftman, I., et al., "Band parameters for III-V compound semiconductors and their alloys," Journal of Applied Physics, vol. 89, No. 11 (Jun. 1, 2001) pp. 5815-5875.

Waltereit, P., et al., "Nitride semiconductors free of electrostatic fields for efficient white light-emitting diodes," Nature, vol. 406 (Aug. 24, 2000), pp. 865-868.

Wikipedia, "Band offset," downloaded from https://en.wikipedia.org/w/index.php?title=Band_offset&oldid=532056869 (created Jan. 26, 2007; last edited Jan. 28, 2013), 1 page.

Xie, J., et al., "On the efficiency droop in InGaN multiple quantum well blue light emitting diodes and its reduction with p-doped quantum well barriers," Applied Physics Letters, vol. 93 (2008), pp. 121107-1 to 121107-3.

Zhao, B., et al., "Effect of state filling on the modulation response and the threshold current of quantum well lasers," Applied Physics Letters, vol. 60, No. 16 (Apr. 20, 1992), pp. 1930-1932.

(56) References Cited

OTHER PUBLICATIONS

Notice of Allowance for Chinese Patent Application No. 201680046374.4, dated Jan. 6, 2022, 2 pages.
Notice of Allowance for Korea Patent Application No. 10-2017-7036898, dated Jan. 21, 2022, 3 pages.
Beeler, M., et al., "III-nitride semiconductors for intersubband optoelectronics: a review," Semiconductor Science and Technology, vol. 28, 074022 (2013), pp. 1-26.
Bour, David P., et al., "AlGaInN MQW Laser Diodes," Chapter 10 of III-V Nitride Semiconductors: Applications and Devices, Edited by E.T. Yu and M.O. Manasreh, Taylor & Francis Books, Inc., (2003), pp. 439-502.
Bulashevich, K.A., et al., "Is Auger recombination responsible for the efficiency rollover in III-nitride light-emitting diodes?," Physica Status Solidi C, vol. 5, No. 6 (2008), pp. 2066-2069.
Chen, Jyh-Chia, et al., "The World's First Monolithic Full-Colour LED," Compound Semiconductor, vol. 22, Issue 8 (Nov./Dec. 2016), pp. 44-47.
Decision of Final Rejection for Japan Patent Application No. 2017-563220, dated Jan. 12, 2021 (2 pages).
Display Daily, "Ostendo Develops First Vertically Integrated RGB LED," downloaded from https://www.displaydaily.com/index.php?option=com_content&view=article&id=48285:ostendo-develops-first-vertically-integrated-rgb-led&catid=152:display-daily&itemid=1016 (2017), 8 pages.
Domen, K., et al., "Interwell inhomogeneity of carrier injection in InGaN/GaN/AlGaN multiquantum well lasers," Applied Physics Letters, vol. 73, No. 19 (Nov. 9, 1998), pp. 2775-2777.
Dutta, N.K., "Current Injection in Multiquantum Well Lasers," IEEE Journal of Quantum Electronics, vol. QE-19, No. 5 (May 1983), pp. 794-797.
El-Ghoroury, H.S., et al., "Growth of monolithic full-color GaN-based LED with intermediate carrier blocking layers," AIP Advances, vol. 6 (2016), pp. 075316-1 to 075316-6.
El-Ghoroury, H.S., et al., "III-nitride monolithic LED covering full RGB color gamut," Proceedings of the SPIE, Physics and Simulation of Optoelectronic Devices XXIV, vol. 9742 (2016), pp. 974222-1 to 974222-8.
Examination Report for EP Patent Application No. 16784685.6, dated Aug. 6, 2020, 9 pages.
Final Decision of Rejection for Japan Patent Application No. 2018-517812, dated Nov. 9, 2021, 5 pages.
Final Office Action for Taiwan Patent Application No. 105117772, dated Aug. 6, 2020, 2 pages.
Final Office Action for U.S. Appl. No. 15/173,485, dated Jun. 30, 2017, 11 pages.
Final Office Action for U.S. Appl. No. 15/173,485, dated Oct. 5, 2018, 15 pages.
Final Office Action for U.S. Appl. No. 15/173,485, dated Apr. 15, 2020, 23 pages.
Final Office Action for U.S. Appl. No. 15/173,500, dated Jul. 3, 2017, 13 pages.
Final Office Action for U.S. Appl. No. 15/173,500, dated Nov. 20, 2018, 16 pages.
Final Office Action for U.S. Appl. No. 15/173,517, dated May 4, 2017, 19 pages.
Final Office Action for U.S. Appl. No. 15/173,517, dated Nov. 16, 2018, 25 pages.
Final Office Action for U.S. Appl. No. 15/287,384, dated Jul. 25, 2018, 22 pages.
First Examination Report for India Patent Application No. 201847016939, dated Sep. 30, 2021, 6 pages.
First Examination Report for Indian Patent Application No. 201747044612, dated Jul. 16, 2021, 7 pages.
First Office Action for Chinese Patent Application No. 201680046374.4, dated May 29, 2019, 12 pages.
First Office Action for Chinese Patent Application No. 201680072137.5, dated Aug. 17, 2020, 13 pages.
First Office Action for Japan Patent application No. 2018-517812, dated Dec. 15, 2020, 7 pages.
Fourth Office Action for Chinese Patent Application No. 201680046374.4, dated Jun. 22, 2021, 10 pages.
Franciosi, A., et al., "Heterojunction band offset engineering," Surface Science Reports, vol. 25, No. 1 (Oct. 1996), pp. 1-140.

* cited by examiner

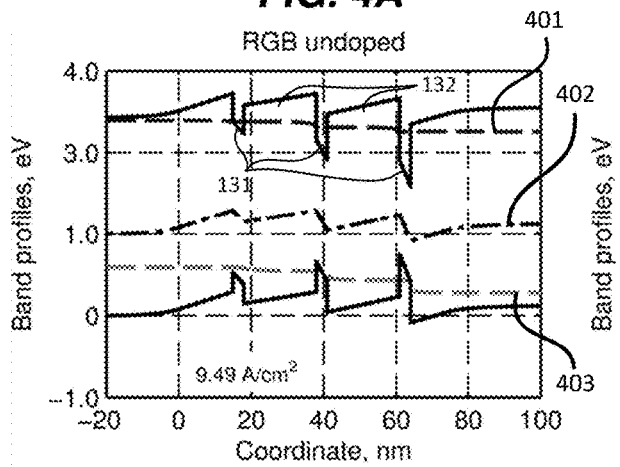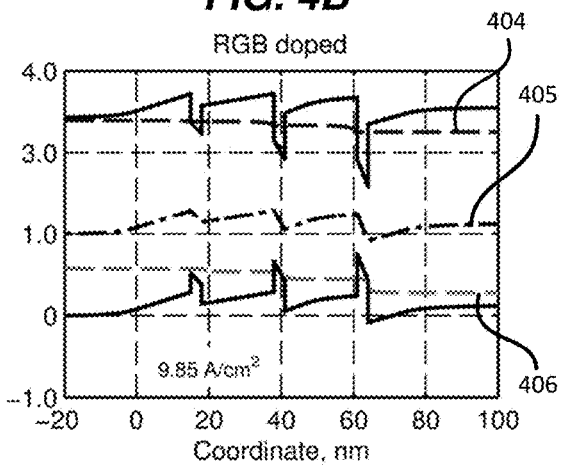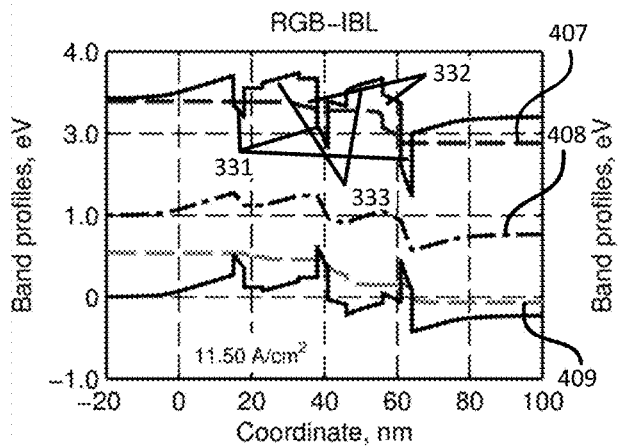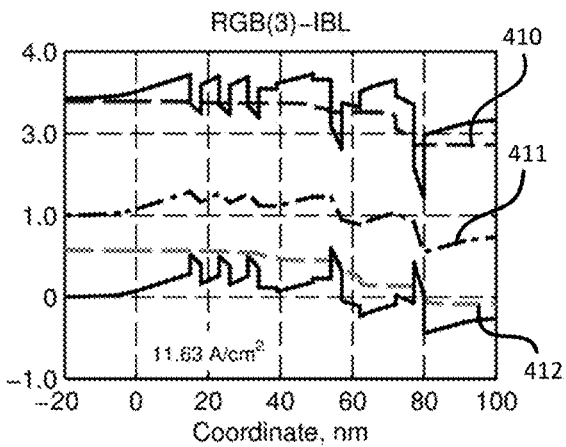
FIG. 4A  FIG. 4B
FIG. 4C  FIG. 4D

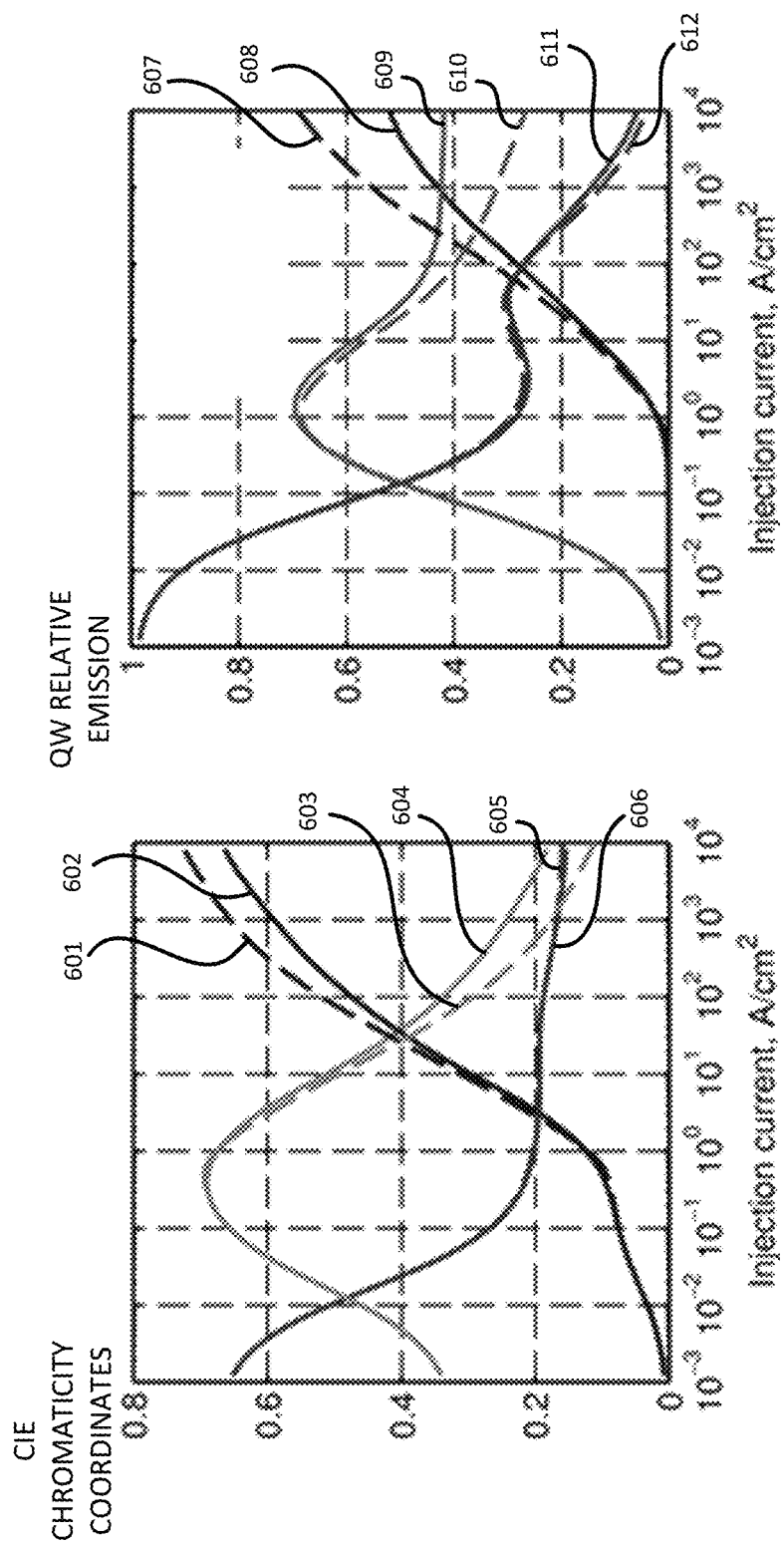

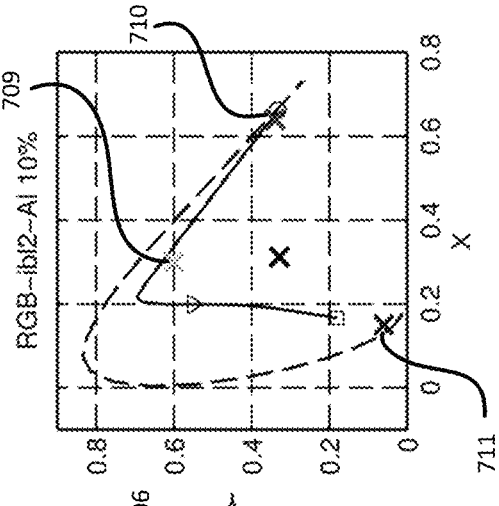
FIG. 7A
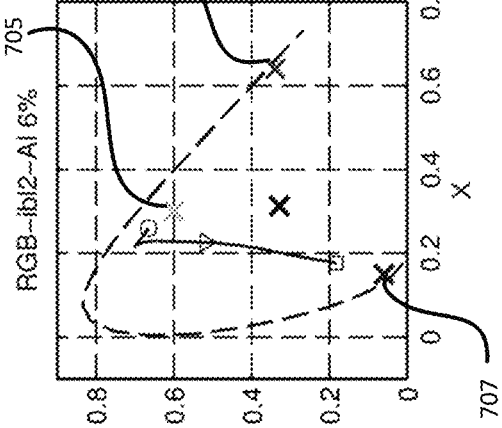
FIG. 7B
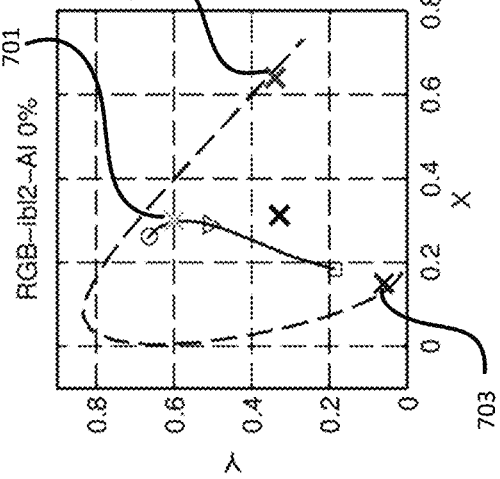
FIG. 7C
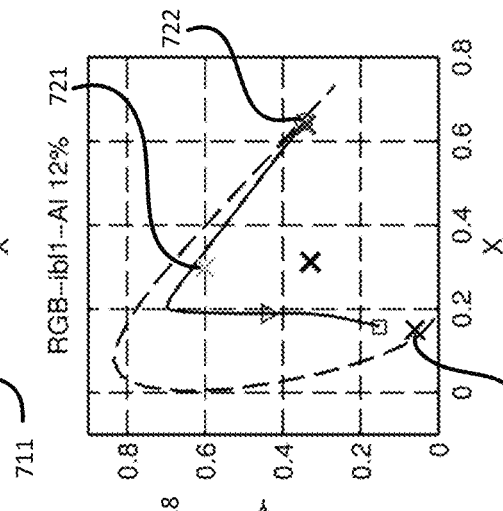
FIG. 7D
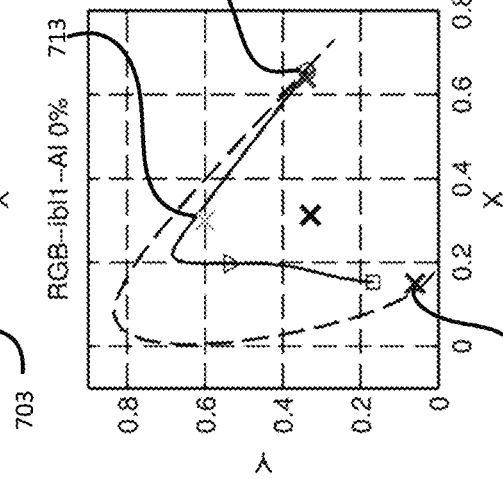
FIG. 7E
FIG. 7F

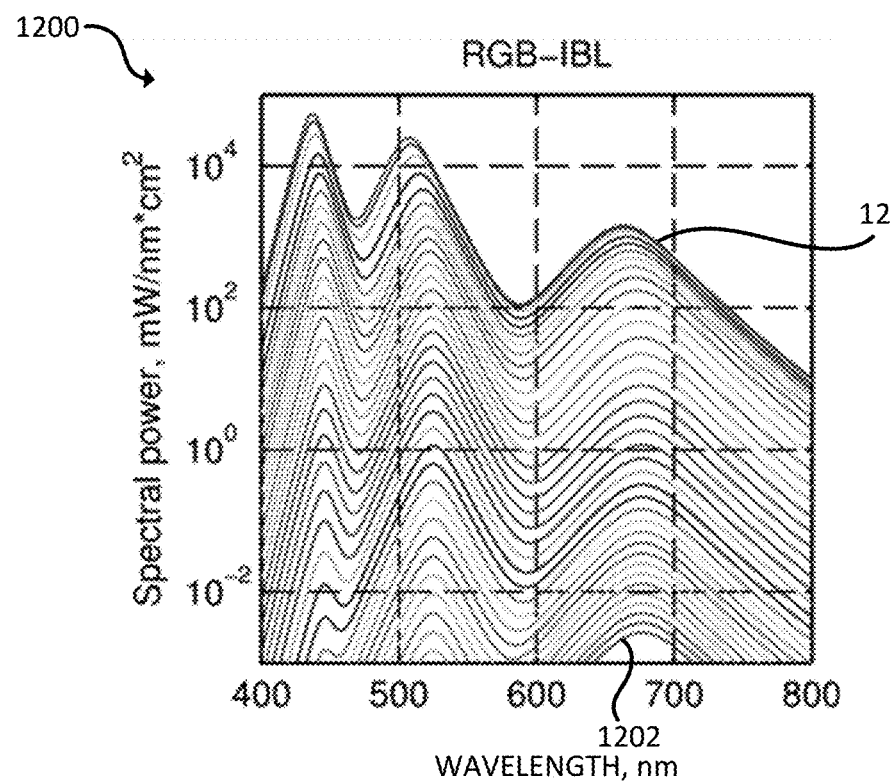
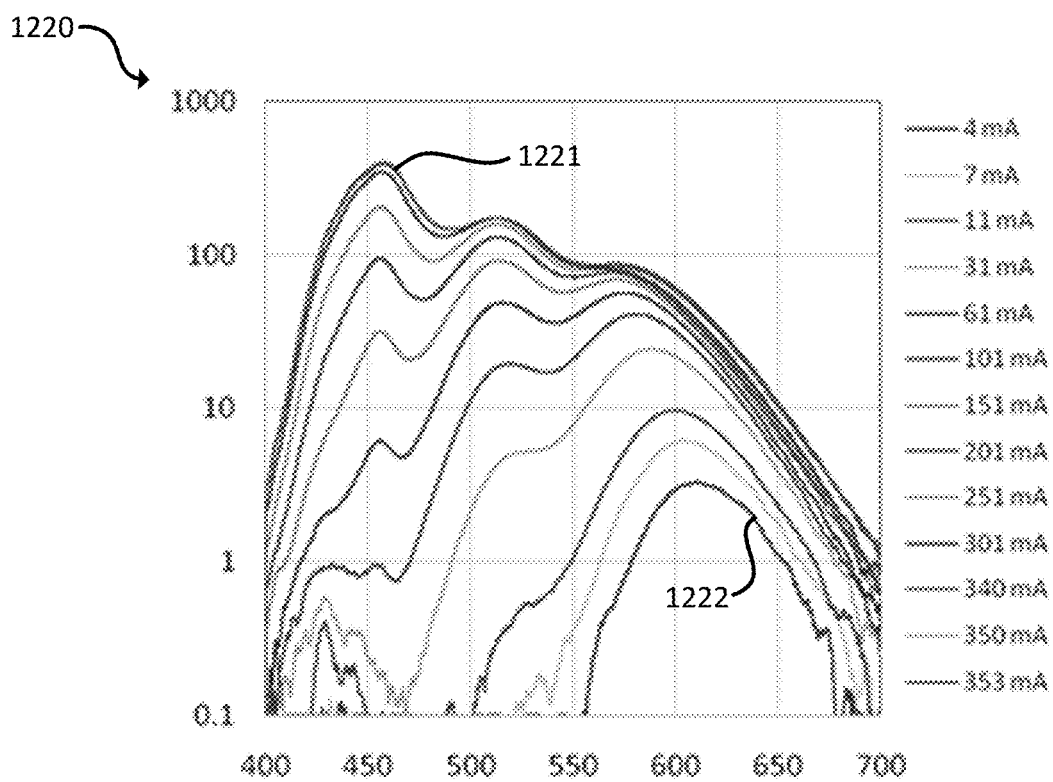
FIG. 12A

(a) at 5mA  (b) at 20 mA  (c) at 30 mA (d) at 100mA  (e) at 200 mA  (f) at 350mA

MULTI-COLOR LIGHT EMITTING STRUCTURES WITH CONTROLLABLE EMISSION COLOR

CROSS-REFERENCE TO RELATED APPLICATIONS

This application is a continuation of U.S. patent application Ser. No. 17/373,659, filed on Jul. 12, 2021, which is a divisional of U.S. patent application Ser. No. 15/173,485, filed on Jun. 3, 2016, which claims the benefit of U.S. Provisional Patent Application No. 62/171,536, filed Jun. 5, 2015, U.S. Provisional Patent Application No. 62/275,650, filed Jan. 6, 2016, and U.S. Provisional Patent Application No. 62/290,607, filed Feb. 3, 2016, the contents of each of which are hereby incorporated by reference as if fully stated herein.

FIELD OF THE INVENTION

The disclosure herein relates to means for tailoring and controlling the distribution of charge carriers in multi-layer active regions of electrically pumped solid state light emitters such as light-emitting diodes and laser diodes.

BACKGROUND OF THE INVENTION

Semiconductor light emitting diode structures have become the established leaders among optical light sources in different emission wavelength ranges. A conventional light-emitting structure is typically comprised of multiple layers of III-V compound semiconductor alloys such as GaAsP, AlGaAs, AlGaInP, or AlGaInN, depending upon the targeted wavelength emission of the diode structure. III-nitride AlGaInN alloys take special place among the possible material systems because of the wide range of available band-gaps. Light emission from AlGaInN covers the entire visible spectrum; III-nitride based light sources are currently being developed also for ultraviolet and infrared emission. Multiple active layer design of an optoelectronic device active region offsets a high level of optical and electrical losses and small strain relaxation length typical for III-nitride based heterostructures.

Multiple quantum well (MQW) design of the optically active region is beneficial for light emitter performance. By increasing the number of active quantum wells (QWs), the injected carriers can be spread among the MQWs thus decreasing the average QW population and minimizing the adverse effects of (i) nonradiative Auger recombination, (ii) QW thermal depopulation, and (iii) QW optical transition saturation. On the other hand, MQW active regions of electrically pumped devices typically suffer from inhomogeneous distribution of charge carriers, both electrons and holes, which are injected from the opposite sides of the diode structure. As a result, uneven and imbalanced population of active QWs unfavorably affects the device performance. In III-nitride light-emitting diodes (LEDs), the overpopulated active QWs often intensify the device efficiency droop either by increasing the nonradiative Auger recombination loss or by elevating the carrier leakage from the device active region. In laser diodes (LDs), the underpumped QWs append their inter-band absorption to the total optical loss thus increasing the laser threshold.

In polar III-nitride heterostructures, non-uniform carrier injection is additionally aggravated by built-in polarization fields and related potential barriers. This sometimes makes nonpolar or semipolar technology an attractive alternative to polar templates. Nonpolar templates, however, do not solve the problem of inhomogeneous injection entirely. Even in the absence of internal polarization fields, MQW structures with sufficiently deep QWs and strong carrier confinement reveal uneven QW populations in a wide range of injection currents, so that the carrier population non-uniformity in III-nitride MQWs is a common feature of both polar and non-polar templates. Carrier injection inhomogeneity increases with active QW depth and, therefore, becomes more pronounced in the longer-wavelength emitters thus holding back the efficiency of III-nitride based light emitters in the so-called "green emission gap".

Several conventional methods employ an MQW active region design in attempt to achieve multi-color emission with fixed or variable emission colors and/or to increase the injection efficiency of the device active region. For example, U.S. Pat. No. 7,323,721 describes a monolithic multi-color MQW structure designed to emit white light by including a sufficient number of QWs with different emission wavelengths, while U.S. Pat. No. 8,314,429 describes a multi junction light emitting structure with the MQWs of each junction being designed to emit a specific wavelength that combines into white-light emission depending on the designed emission intensity of each of the multiple junctions comprising the structure. U.S. Pat. Nos. 7,058,105 and 6,434,178 describe approaches to achieve high carrier injection efficiency by incorporating means for increased optical and, respectively, electrical confinements of MQW active region. U.S. Patent Publication No. 2011/0188528 describes a MQW III-nitride light-emitting diode structure that achieves high carrier injection efficiency by using shallow QWs designed to avoid excessive carrier confinement and attain uniform MQW carrier population. U.S. Patent Publication No. 2010/0066921 describes a MQW III-nitride light emitting structure epitaxially grown on micro rods in which the epitaxial growth plane of the micro rods promotes higher indium incorporation in the semi-polar and non-polar orientation which can lead to multi-color emission form the MQW structure. Thus, the foregoing conventional approaches use particular ad hoc approaches relevant to their specific goals.

BRIEF DESCRIPTION OF THE DRAWINGS

The embodiments herein are illustrated by way of example and not by way of limitation in the figures of the accompanying drawings in which like references indicate similar elements. It should be noted that references to "an" or "one" embodiment of the disclosure are not necessarily to the same embodiment, and they mean at least one. Also, in the interest of conciseness and reducing the total number of figures, a given figure may be used to illustrate the features of more than one embodiment of the disclosure, and not all elements in the figure may be required for a given embodiment.

FIGS. 4A-4D illustrate results of active region band profile simulations in three-color Red-Green-Blue (RGB) LED structures according to example embodiments disclosed herein. In FIGS. 4A and 4B, the three-color Red-Green-Blue (RGB) LED structure is designed according to the conventional arrangement of FIG. 1 without intermediate carrier blocking layers (IBLs). In FIGS. 4C and 4D, the three-color Red-Green-Blue (RGB) LED structure is designed according to an embodiment disclosed herein using IBLs. In FIGS. 4A-4D, band profiles are calculated at an LED injection level of 10 A/cm$^2$ and the band gap vertical scale is reduced by 1 eV for illustrative purposes. FIG. 4C illustrates the active region band profile for the RGB-IBL-LED structure of FIG. 3 with IBLs designed for the purpose of emission color control.

In FIGS. 5A-5D, a circle marker indicates starting point of low injection current, a square marker indicates the end point of high injection current, and a triangle marker corresponds to nominal injection level of 10 A/cm$^2$ used in FIGS. 4A-4D. The various crosses ("X") indicate standard RGB color gamut primaries of different colors. FIG. 5C illustrates the emission color control achieved in the RGB-IBL-LED structure illustrated by FIG. 3 and FIG. 4C.

FIGS. 6A-6B illustrate the details of a color control process in the RGB-IBL LED structure illustrated by FIG. 3 and FIG. 4C according to example embodiments disclosed herein. FIG. 6A illustrates the injection dependence of the CIE chromaticity coordinates for controlled RGB emission. FIG. 6B illustrates the injection dependence of relative optical emission power from each QW. For comparison, dashed lines in FIGS. 6A-6B indicate corresponding dependencies for the RGB(3)-IBL LED illustrated by FIG. 4D.

FIGS. 7A-7F illustrate sensitivity of MQW carrier injection and output color control to the design of IBL elements of the LED structure according to example embodiments disclosed herein. Each of FIGS. 7A-7F illustrates the CIE chromaticity diagram of an RGB-IBL LED similar to 300 of FIG. 3 with compositions of the two intermediate carrier blocking layers (IBL1 and IBL2) having modified design parameters.

FIGS. 9A-9D illustrate CIE chromaticity coordinates for an RGB-IBL LED such as structure 300 of FIG. 3 with designed IBL1 and IBL2 compositions and varied doping of IBL1.

FIGS. 10A-10D illustrate CIE diagrams for an RGB-IBL LED such as structure 300 of FIG. 3 with designed IBL1 and IBL2 compositions and varied p-doping level in IBL2.

FIG. 11B illustrates the band profile of an RGB-IBL LED structure in which an additional intermediate carrier blocking layer is incorporated to reduce the full color control current injection range.

FIG. 11C illustrates the injection dependence of the light emission gamut CIE RGB chromaticity coordinates of the RGB-IBL LED structure in which an additional intermediate carrier blocking layer is incorporated.

FIG. 12A illustrates a comparison of a calculated variable-color emission spectra with experimental electroluminescence spectra obtained from a monolithic color-tunable nitride-based three-color RGB-IBL LED epitaxially grown according to example embodiments disclosed herein.

DETAILED DESCRIPTION OF THE INVENTION

Figure 1:
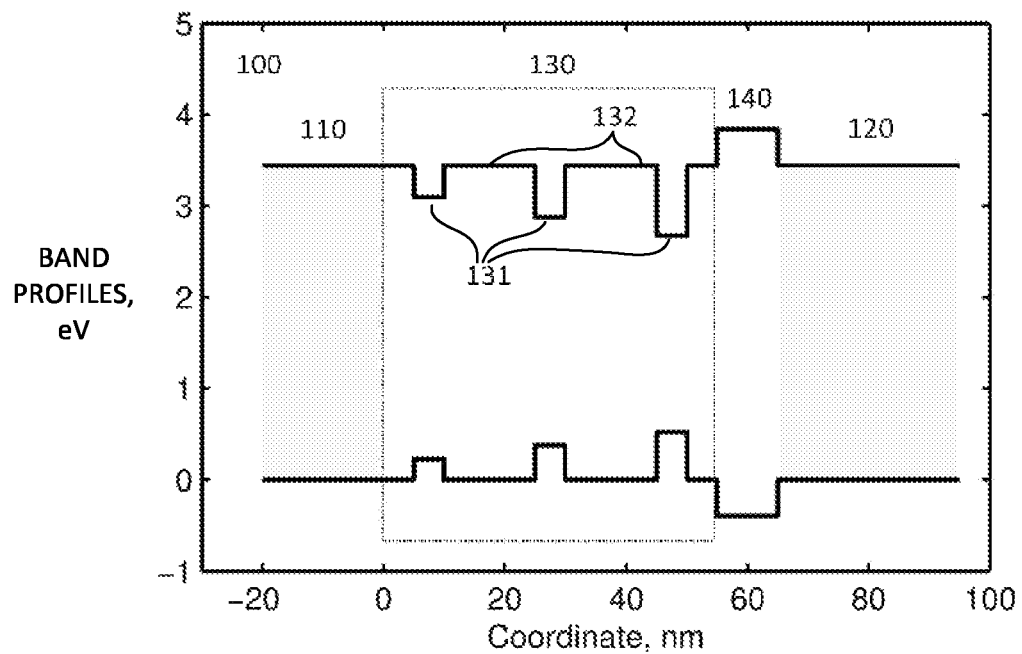
FIG. 1 illustrates a typical energy-band profile of an active region for explaining a conventional hetero junction multi-layer quantum-confinement-based light-emitting diode structure.

Various embodiments and aspects of the disclosure herein will be described with reference to details discussed below, and the accompanying figures will illustrate the various embodiments. The following description and figures are illustrative of the disclosure herein and are not to be construed as limiting. Numerous specific details are described to provide a thorough understanding of various embodiments. However, it is understood that embodiments disclosed herein may be practiced without these specific details. In certain instances, well-known or conventional details, such as circuits, structures, and techniques, are not described in order to provide a concise discussion of example embodiments.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The inventors herein have recognized the desirability to provide a systematic approach for tailoring a charge carrier population distribution and controlling an active layer population uniformity in multi-layered active regions of semiconductor light-emitting structures, such that it becomes possible to have uniform carrier population distribution in the active layer and emitter efficiency is enhanced. Also, the inventors herein have recognized that it is desirable to deliberately tailor or directly control the carrier population distribution among the active layers of the light-emitting structure, such that it becomes possible to create monolithic multi-color semiconductor light emitters with fixed pre-designed emission spectrum (for instance a white-color emitter) and to develop light emitters with variable emission color, among many possible other applications. As will be illustrated by the following descriptions and figures, a systematic method is disclosed herein for achieving selective and controllable charge carrier injection into multiple active layers of solid state light-emitting diode structures. For example, according to an embodiment herein, multi-layered solid state light emitter structures are designed and epitaxially grown incorporating means for tailoring the charge carrier transport in the device multi-layer active region and controlling the active layer carrier populations for the numerous applications that benefit from such capability. Also disclosed herein are examples of numerous possible applications, for example, display applications and general lighting applications, high-efficiency solid state light emitters, multi-color monolithic semiconductor light sources with fixed or variable emission wavelength, and white-light semiconductor emitters.

According to one aspect of the disclosure herein, a systematic method for tailoring and controlling the charge carrier population distribution in multi-layered active regions of semiconductor light emitter structures such as light emitting diodes and laser diodes is provided by means of incorporating into the device active region intermediate carrier blocking layers (IBLs) that are specifically designed in composition and doping.

According another aspect of the disclosure herein, targeted modification of the injection characteristics of multi-layered light-emitting structures is provided by (i) balancing the asymmetry in electron and hole transport between the optically active layers and (ii) balancing the carrier capture rates into the optically active layers, thus increasing the overall active region injection efficiency and reducing the active region overflow, carrier leakage, and carrier recombination loss outside the active region.

According yet another aspect of the disclosure herein, a monolithic semiconductor light-emitting device is provided with controllable sequential carrier injection in a multi-layered active region.

According to an embodiment disclosed herein, a monolithic semiconductor light-emitting device is provided with uniformly populated active layers in a multi-layered active region.

According to another embodiment disclosed herein, a monolithic semiconductor light-emitting device is provided with controllable and tunable multi-color emission with fixed or variable emission wavelength.

According to yet another embodiment disclosed herein, a monolithic semiconductor light-emitting device is provided with controllable and tunable multi-color emission that matches a specified color emission gamut.

According to still another embodiment disclosed herein, a monolithic semiconductor light-emitting device is provided with controllable and tunable multi-color emission with wide a color emission gamut.

According to one embodiment disclosed herein, a monolithic semiconductor white-light-emitting device is provided with controllable emission color temperature.

According to an embodiment disclosed herein, a monolithic semiconductor light-emitting device is provided with single color emission that attains high internal quantum efficiency (EQE).

In the following descriptions, III-nitride semiconductor alloys are used as an example material system, since III-nitride semiconductor alloys are poised to make a significant impact in light emission applications. In addition, multiple-quantum-well (MQW) active regions are used in this disclosure as an example active region design, since quantum well (QW) heterostructures are commonly employed as quantum confinement structures for optically active layers. It will be understood that the embodiments disclosed herein are also applicable to other materials systems and optically active layers incorporating other means of quantum confinement such as the use of quantum wires and quantum dots.

Turning to FIG. 1, FIG. 1 illustrates a typical band profile of an active region of a conventional hetero junction based light-emitting diode structure. Light-emitting diode structure 100 is comprised of an n-doped layer 110, an optically active region 130, and a p-doped layer 120. Optically active region 130 of the diode structure 100 is often completed with the electron blocking layer (EBL) 140 placed outside of the optically active region 130 at the p-side of the diode structure 100. In quantum-confinement based LEDs, multi-layered optically active region 130 can be further comprised of the multiple quantum well (MQW) layers 131 separated by the quantum barrier layers 132. The III-V material alloy composition in the optically active MQW layers 131 of active region 130 would typically be selected to set up the desired active layer band gap and, consequently, the fixed emission wavelength of the optically active region 130 of the light-emitting diode structure 100. Electron blocking layer (EBL) 140, which is incorporated in the diode structure 100 to reduce the electron leakage at the structure p-side, would typically be a heavily p-doped wide-band-gap layer having a band gap that is greater than the band gap of the barrier layers 132 of the active region 130 of the diode structure 100. Averting carrier leakage has been a valuable mechanism to increasing light emitter efficiency, and EBL structures of different kinds are now often standard features of most III-nitride LED designs. It should be emphasized however that carrier blocking layers located outside of the optically active region have little or no effect on the uniformity or carrier distribution inside the active region and therefore cannot typically be used as a design element to control or tailor the active layer carrier populations in multi-layer light-emitting devices. In fact, such a situation might unfavorably affect the carrier distribution inside the active region due to possibly causing an excessive polarization field, especially in active regions of long wavelength emitters.

Figure 2:
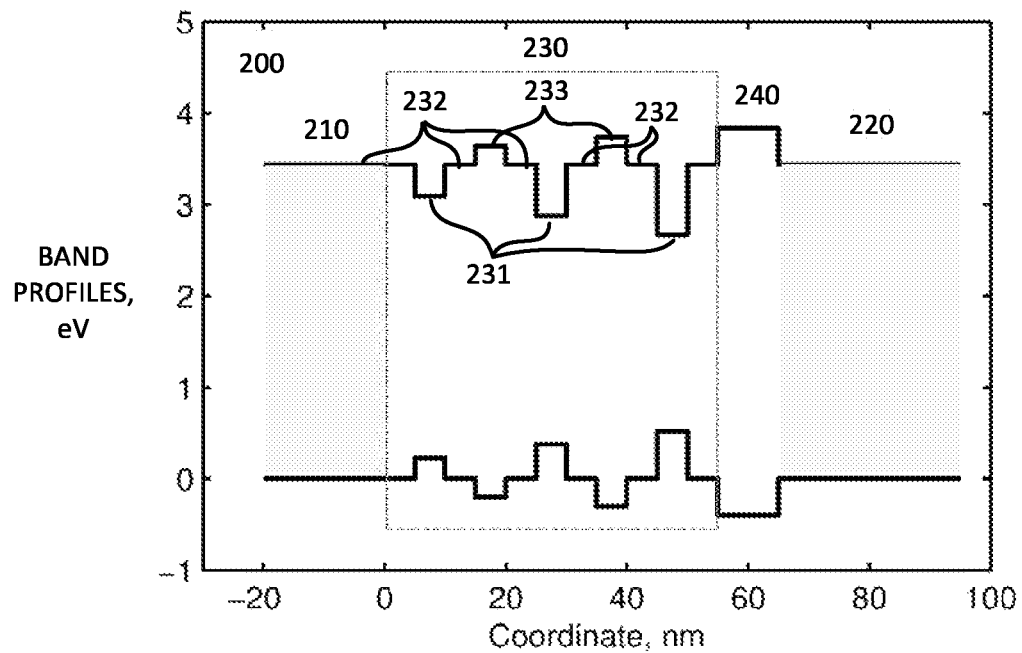
FIG. 2 illustrates an active region energy-band profile for explaining the layout of a hetero-junction multi-layer quantum-confinement-based light-emitting diode structure according to an embodiment disclosed herein.

FIG. 2 illustrates an active region band profile for explaining a hetero-junction multi-layer quantum-confinement-based light-emitting diode structure according to one embodiment. Light-emitting diode structure 200 is comprised of an n-doped layer 210, an optically active region 230, and a p-doped layer 220. In the embodiment of FIG. 2, optically active region 230 of the diode structure 200 includes electron blocking layer (EBL) 240 placed outside of the optically active region 230 at the p-side of the diode structure 200. In other embodiments, EBL 240 is not included. Multi-layered optically active region 230 can be further comprised of the multiple quantum well (MQW) layers 231 separated by the quantum barrier layers 232. In the embodiment of FIG. 2, specially designed intermediate carrier blocking layers (IBLs) 233 with selected band-gaps, as defined by their respective compositions, and band offsets, as affected by their doping levels, are incorporated directly into the optically active region 230 to provide means for controlling the carrier transport between the active layers 231 and balancing the carrier capture rates by active layers 231. The multiple layers of the light-emitting diode structure of FIG. 2 can be composed of III-V compound semiconductor alloys such as GaAsP, AlGaAs, AlGaInP, or AlGaInN, depending upon the targeted wavelength emission of the diode structure. A diode structure according to the embodiment of FIG. 2 is applicable to solid state light emitting diode structures with either polar, or semi-polar, or non-polar crystalline structures having optically active layers incorporating means of quantum confinement such as quantum wells, quantum wires or quantum dots.

Figure 3:
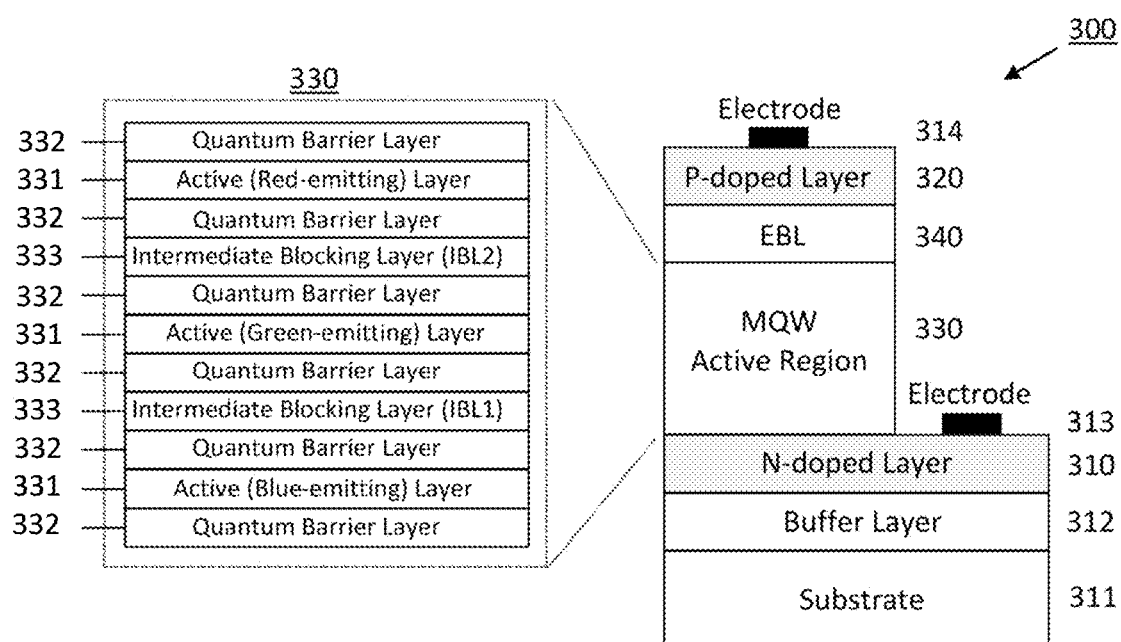
FIG. 3 illustrates a simplified schematic cross-sectional view for explaining a hetero-junction multi-layer quantum-confinement-based light-emitting diode structure according to an embodiment disclosed herein.

FIG. 3 illustrates a simplified schematic cross-sectional view for explaining a monolithic three-color hetero-junction multi-layer quantum-confinement GaN-based LED device structure 300 according one embodiment. In the embodiment of FIG. 3, LED structure 300 is formed by metal organic chemical vapor deposition (MOCVD). However, LED structure 300 may be formed by any epitaxial deposition technique. LED structure 300 comprises a suitable substrate 311 for epitaxial deposition thereon (e.g., a GaN, Si, sapphire ($Al_2O_3$), or silicon carbide (SiC) wafer with a nucleation/buffer layer 312 formed thereon) and an overlying N-doped layer 310 of the active region 330 (e.g., comprising Si as N-type dopant.) Overlying the N-layer 310 is multi-layered optically active region 330 (e.g., comprised of combination of GaN, InGaN, AlGaN, and AlInGaN layers.) Overlying the active region 330 is an optional electron blocking layer (EBL) 340 typically comprised of AlGaN and followed by P-doped layer 320 (e.g., comprising Mg as P-type dopant.) Finally, electrodes 313 and 314 are provided for electrically contacting N- and P-doped layers 310 and 320, respectively.

Still referring to FIG. 3, multi-layer (MQW) active region 330 comprises a stacked plurality of quantum barrier layers 332 with respective quantum well optically active layers 331, for blue- green- and red-light emission. Each of the barrier layers 332 is about 5-20 nm-thick and comprised mainly of GaN; optically active layers 331 are each about 2-3 nm-thick and comprised of InGaN. As shown in FIG. 3, the optically active layers 331 may comprise a red-emitting layer, a green-emitting layer and a blue-emitting layer. It will be appreciated that in other embodiments, other optically active layers may be used, including additional red-green- and blue-emitting layers, as well as aquamarine-emitting layers.

The multi-layer active region 330 also comprises specially designed intermediate carrier blocking layers (IBLs) 333 which, in this embodiment, include an additional amount of aluminum (Al) and doping to adjust their respective band-gap and band offsets. Selection of design parameters for intermediate blocking layers (IBLs) 333 functions to selectively control the population of injected carriers inside the respective quantum wells in order to enhance their spontaneous light emission at a given carrier injection level. In the embodiment of FIG. 3, the band-gap of an intermediate carrier blocking layer (IBL) is greater than that of the associated quantum well layer and its thickness is selected to avoid high forward voltage and excessive heating which can lead to performance degradation. However, other band-gaps and thicknesses may be selected.

As will be explained in further detail below, optically active layers 331 in the structure can each be comprised of a multiplicity of QW layers separated by additional barrier layers 332 as required to achieve full coverage of the device emission color gamut. In this regard, some of the following descriptions describe modifications to the structure illustrated in FIG. 3, such that FIG. 3 is merely one example of the arrangement and number of quantum barrier layers, active layers and intermediate blocking layers included in the LED structure.

Moreover, multiple-quantum-well (MQW) active regions are used as quantum confinement structures in the embodiment of FIG. 3. However, other quantum confinement structures may be used, such as a quantum well or wells, quantum wires and quantum dots. In this regard, in embodiments involving quantum wires and quantum dots, the combination of a quantum barrier layer, an active layer and the quantum barrier layer on the other side of the active layer as shown in FIG. 3 is replaced by quantum wires or quantum dots as the quantum confinement structures.

FIGS. 4A and 4B illustrate results of an active region band profile simulation for multiple-color Red-Green-Blue (RGB) LED structures designed according to the embodiment of FIG. 1 (FIG. 4A relates to an undoped RGB structure; FIG. 4B relates to a doped RGB structure). FIGS. 4C AND 4D illustrate results of an active region band profile simulation for multiple-color Red-Green-Blue (RGB) LED structures designed according to the embodiment of FIG. 2 in which IBLs 233 have been incorporated into the active region (FIG. 4C relates to an RGB-IBL structure; FIG. 4D relates to an RGB(3)-IBL structure). The simulation results shown in FIGS. 4A-4D were obtained by using a simulation program, such as Optical Device Modeling & Simulation (ODMS) software. For clarity of results, the EBL layer has been excluded from these simulations.

FIGS. 4A and 4C illustrate the active region band profiles of the structures of FIG. 1 and FIG. 2, respectively. FIG. 4C illustrates the simulated active region energy band profiles of an RGB-IBL LED device structure with the active layer band-gaps and the IBLs compositions and doping levels selected for variable (or tunable) color control over a desired light emission gamut. All LED energy band profiles illustrated in FIGS. 4A-4D are simulated at approximately the same LED injection level of 10 A/cm$^2$. The dashed lines in FIGS. 4A-4D show the quasi-Fermi levels for electrons (lines 401, 404, 407, 410) and holes (lines 403, 406, 409, 412). The dashed-dotted lines (lines 402, 405, 408, 411) in FIGS. 4A-4D indicate the internal potential distribution inside the active region.

Table 1 provides examples of active region layout design parameters of the designed RGB-IBL LED structure of FIG. 4C, including the semiconductors material composition of each of the structure's layers and their respective doping levels. Actual emission results of LED structures epitaxially grown in accordance with the disclosure herein are discussed below and confirm the described simulation results for an RGB-IBL LED structure for FIG. 4C.

TABLE 1

| Layer | Width nm | Composition | Donors ($10^{17}$ cm$^{-3}$) | Acceptors ($10^{17}$ cm$^{-3}$) |
|---|---|---|---|---|
| P-Layer | 250 | GaN | 0.0 | 100.0 |
| EBL | 15.0 | Al$_{0.20}$Ga$_{0.80}$N | 0.0 | 500 |
| Barrier | 10.0 | GaN | 0.0 | 5.0 |
| Red QWs | 3.0 | Ga$_{0.65}$In$_{0.35}$N | 0.0 | 0.0 |
| Barrier | 5.0 | GaN | 0.0 | 0.0 |
| IBL2 (Green-Red) | 10.0 | Al$_{0.20}$Ga$_{0.80}$N | 0.0 | 15.0 |
| Barrier | 5.0 | GaN | 0.0 | 0.0 |
| Green QWs | 3.0 | Ga$_{0.75}$In$_{0.25}$N | 0.0 | 0.0 |
| Barrier | 5.0 | GaN | 0.0 | 0.0 |
| IBL1 (Blue-Green) | 10.0 | Al$_{0.07}$Ga$_{0.93}$N | 0.0 | 0.0 |
| Barrier | 5.0 | GaN | 0.0 | 0.0 |
| Blue QWs | 3.0 | Ga$_{0.85}$In$_{0.15}$N | 0.0 | 0.0 |
| Barrier | 10.0 | GaN | 1.0 | 0.0 |
| N-Layer | 500 | GaN | 10.0 | 0.0 |

In another embodiment, which is illustrated by FIG. 4D, additional active layers are incorporated into the diode structure active region in order to balance the device light emission gamut. According to this embodiment, the RGB-IBL device active region incorporates additional Blue-emitting QWs introduced to improve RGB light emission gamut coverage. Adding more Blue-emitting QWs increases the total carrier capture by the Blue-emitting QWs, thus extending the emission characteristics of the RGB-IBL LED device to include a desired color emission primary (blue, in the embodiment of FIG. 4D) of the light emission gamut.

Figure 5A:
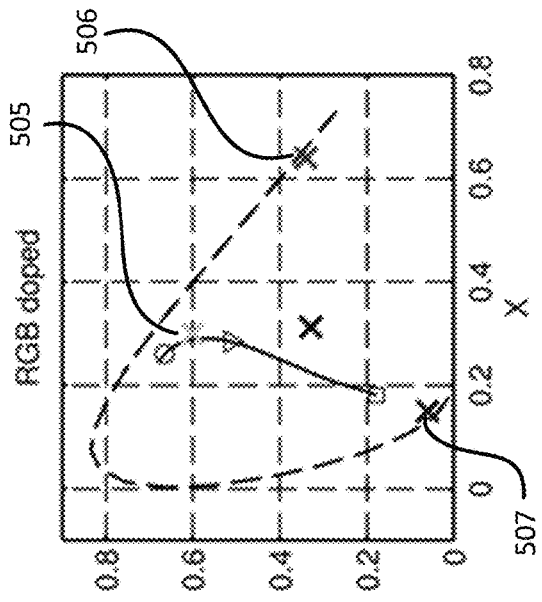
FIGS. 5A-5D illustrates a comparison of CIE chromaticity diagrams calculated in a range of injection currents for three-color RGB LED structures explained using FIGS. 4A-4D according to example embodiments disclosed herein. The structures for FIGS. 5A-5D correspond to the structures for FIGS. 4A-4D, respectively.
Figure 5B:
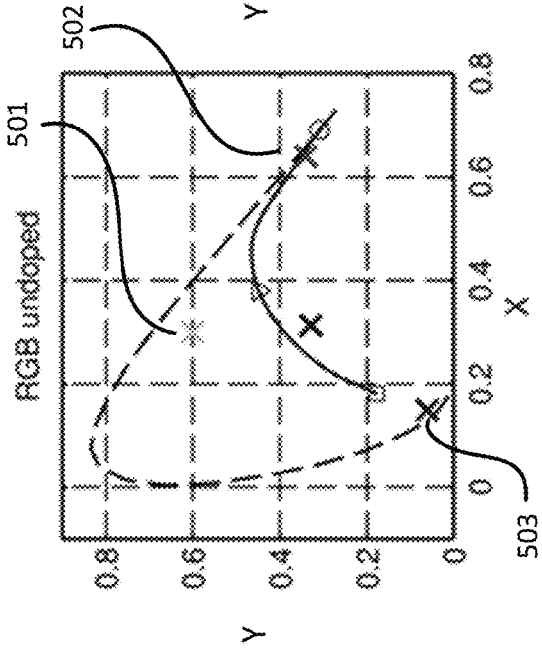
Figure 5C:
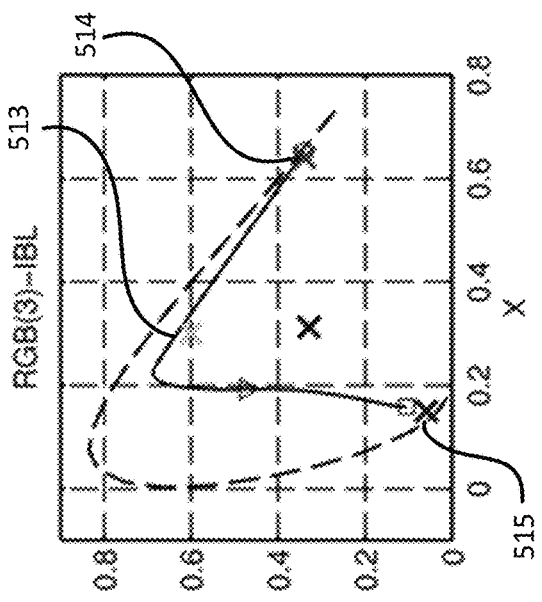
Figure 5D:
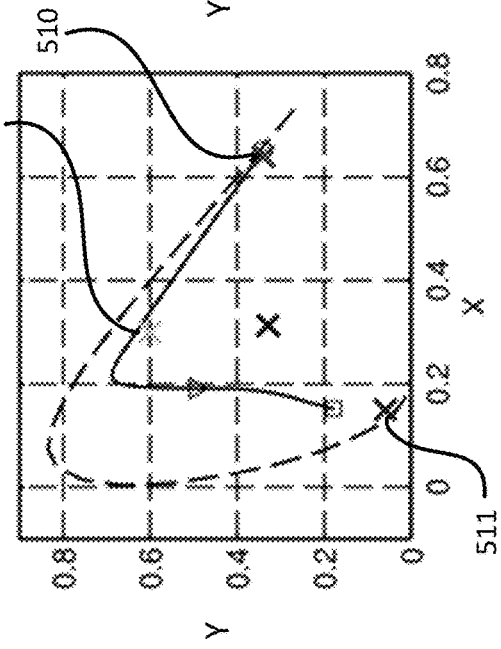
Figure 8B:
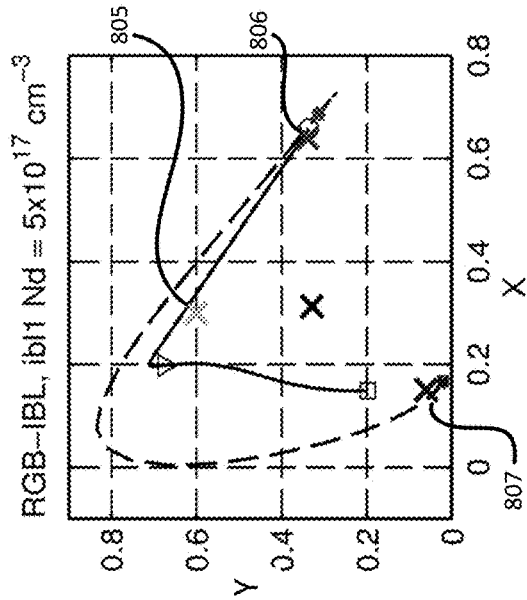
FIGS. 8A-8D illustrate processes of designing RGB-IBL LED structures according to example embodiments disclosed herein. Each of FIGS. 8A-8D illustrates the CIE chromaticity diagram of an RGB-IBL LED such as structure 300 FIG. 3 with designed IBL1 and IBL2 compositions and varied doping of the first intermediate carrier blocking layers (IBL1).
Figure 8D:
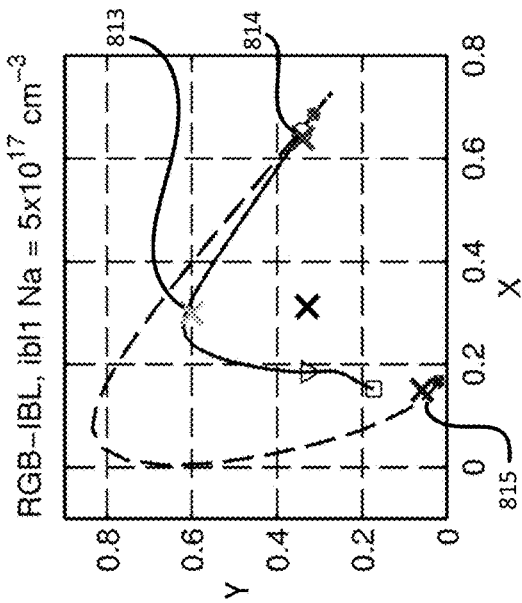
Figure 8A:
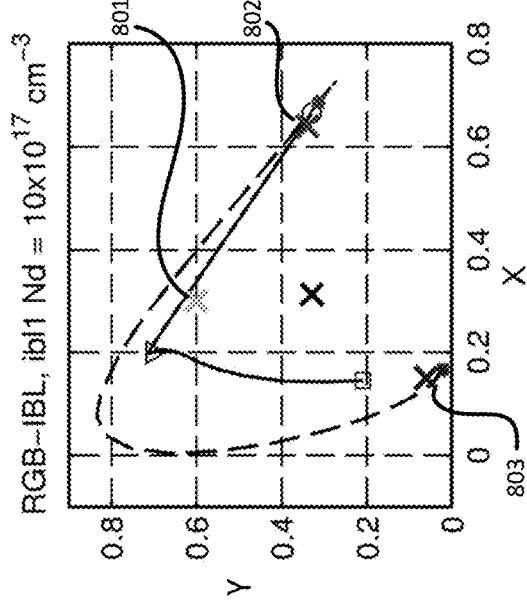
Figure 8C:
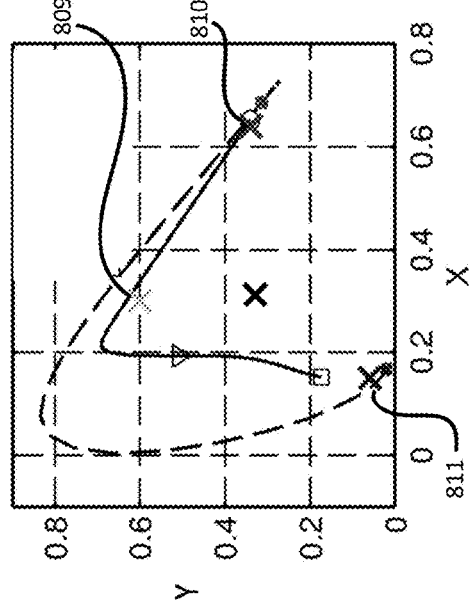
Figure 9B:
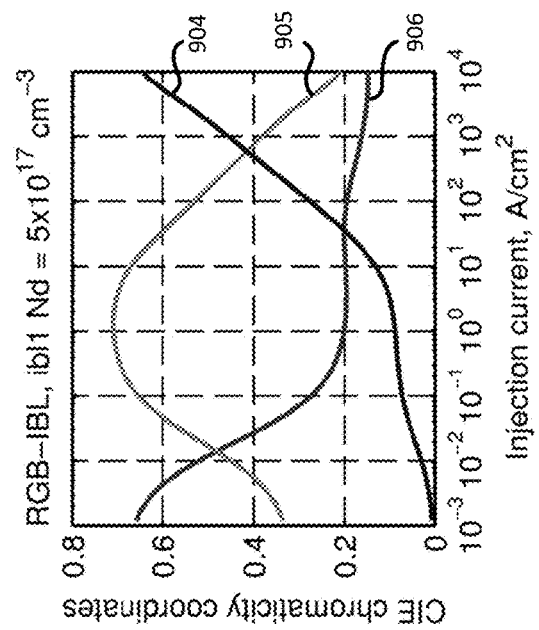
FIGS. 9A-9D illustrate the injection dependence of the CIE chromaticity coordinates for the RGB-IBL LED structures of FIGS. 8A-8D.
Figure 9D:
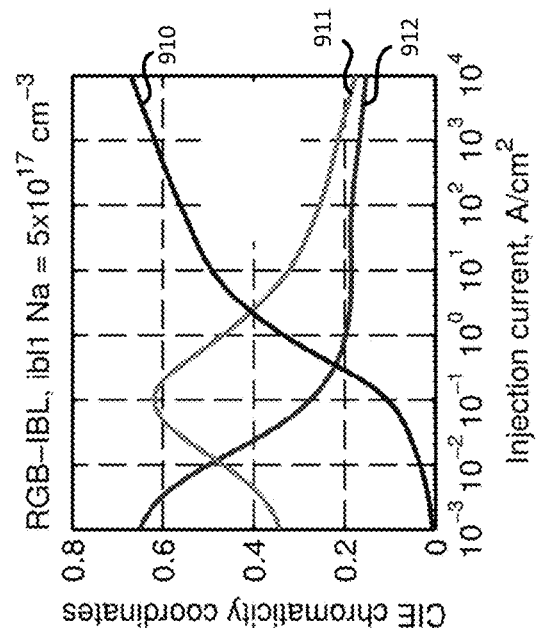
Figure 9A:
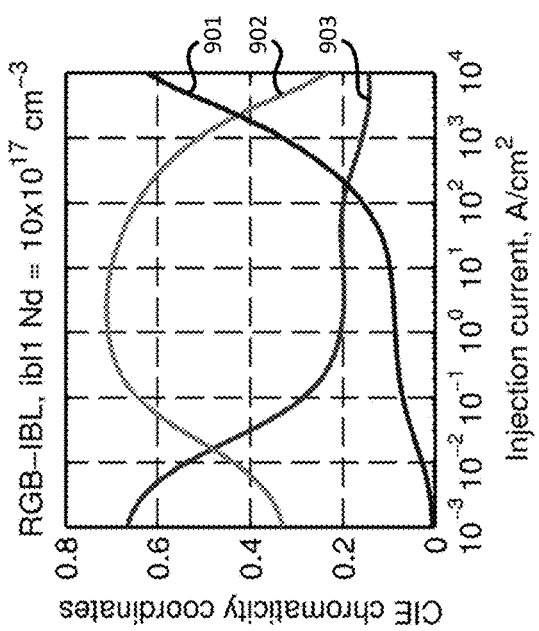
Figure 9C:
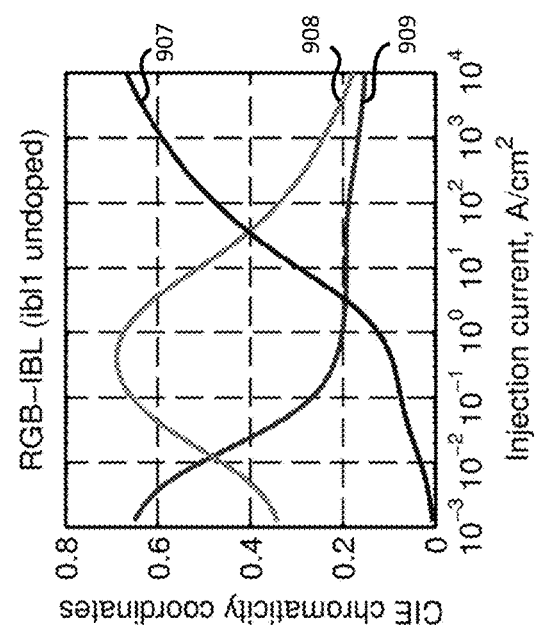
Figure 10A:
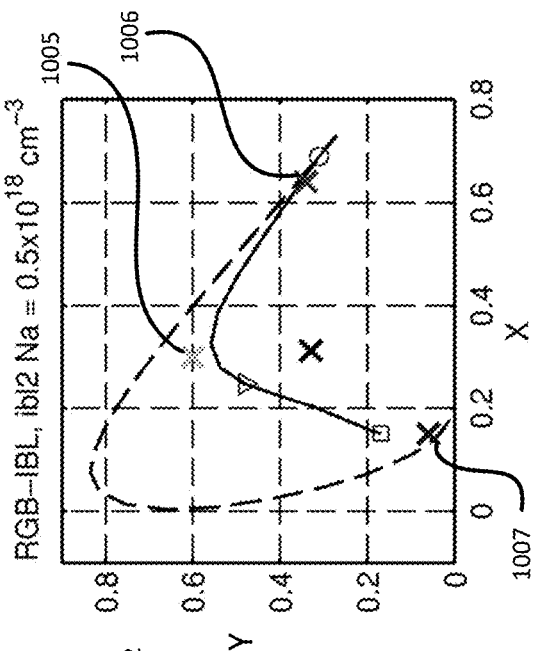
FIGS. 10A-10D illustrate a process of designing an RGB-IBL LED structure according to example embodiments disclosed herein.
Figure 10B:
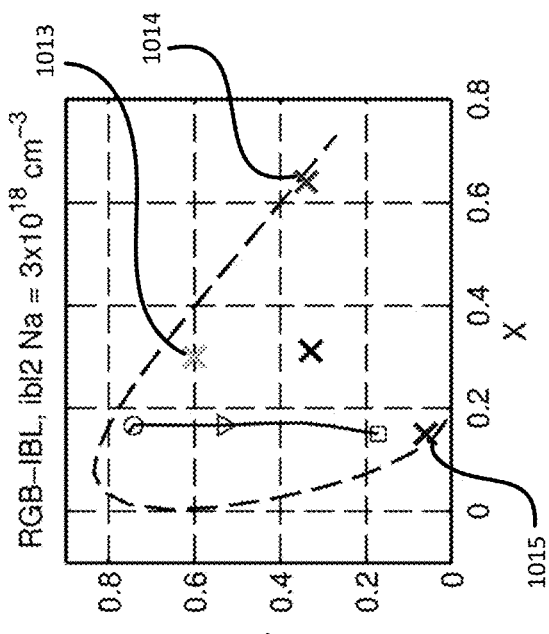
Figure 10C:
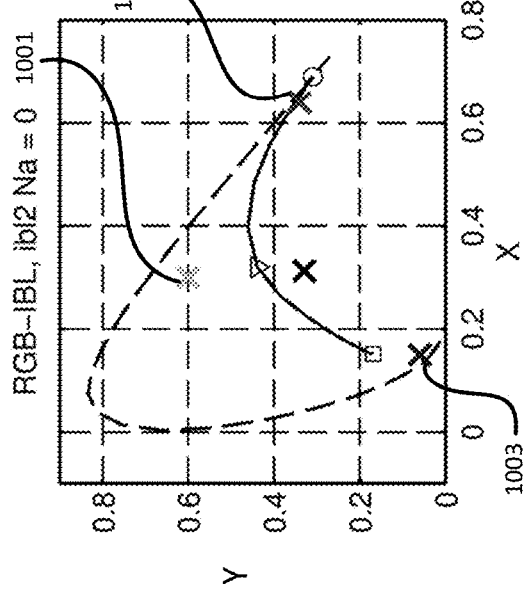
Figure 10D:
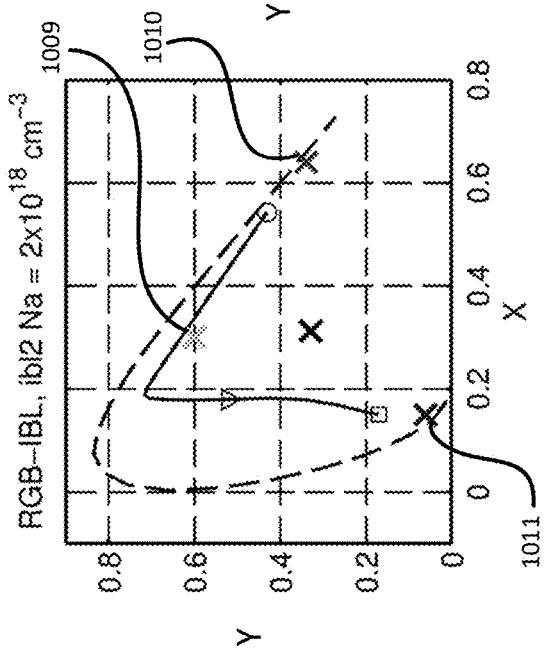

FIGS. 5A-5D compare light emission gamut (CIE chromaticity diagrams) for the multi-color LED structures of FIGS. 4A-4D over a range of injection currents. The embodiments of FIGS. 5A and 5C correspond to the embodiments of FIGS. 4A and 4C, respectively. In the FIGS. 5A-5D, the circle markers indicate the starting point at the lowest injection (simulated value of 1 µA/cm$^2$), the square markers correspond to the highest injection level (simulated value of 10 kA/cm$^2$), the triangles mark the injection level (simulated value of 10 A/cm$^2$) used in FIGS. 4A-4D, and the crosses ("X") indicate the primary colors of a standard RGB gamut (red is indicated by crosses 502, 506, 510, 514; green is indicated by crosses 501, 505, 509, 513; blue is indicated by crosses 503, 507, 511, 515), such as an HD color gamut, for example. FIGS. 5C and 5D illustrate embodiments in which RGB-IBL devices are designed with selected IBLs band-gaps and band-offsets to provide a controllable carrier injection distribution within a device active region and tunable multi-color emission covering the standard RGB gamut. FIG. 5D, in particular, shows an embodiment in which the emission of the RGB-IBL LED 300 of FIG. 3 (and also of FIG. 4C) is further improved to achieve full coverage of the standard RGB gamut by adding two Blue-emitting QWs before growth of the associated barrier layer and the first IBL (herein referred to as, IBL1).

FIGS. 6A-B detail the process of color control in the RGB-IBL LED 300 of FIG. 3 (and also of subplot C of FIG. 4). In FIGS. 6A-B, lines 606 and 611 indicate red; lines 604 and 609 indicate green, lines 602 and 608 indicate blue. FIG. 6A illustrates the injection dependence of the light emission gamut CIE RGB chromaticity coordinates. FIG. 6B illustrates the relative optical emission power in each QW color group, $P_i/\Sigma P_i$ where index i relates to a Red-, Green-, or Blue-emitting QW, respectively. Dashed lines (lines 601 and 607 indicate blue; lines 603 and 610 indicating green; lines 605 and 612 indicating red) show the corresponding injection dependencies for RGB-IBL(3) light emitting structure incorporating three Blue-emitting QWs illustrated in plot 470 of FIG. 4. It should be noted that additional optically active QW layers 331 separated by additional barrier layers 332 are added in the device structure of FIG. 3 as required to achieve full coverage of the device emission color gamut and/or a desired $P_i/\Sigma P_i$ relative optical emission power in each QWs color group. Accordingly, the structure of FIG. 3 may include fewer or additional optically active QW layers 331 and, correspondingly, fewer or additional barrier layers 332 to separate them.

Referring again to FIGS. 5A-5D, a comparison of the light emission gamut of FIGS. 5A and 5C (which also correspond to FIGS. 4A and 4C, respectively) illustrates the effect of incorporating the IBLs with selected band-gaps and band-offsets into the active region of a semiconductor light emitting diode structure that incorporates multiple active layers with band-gaps corresponding to a multi-color light emission. As can be seen from FIG. 5A, without the IBLs, the color emission trajectory with the increase in the carriers injection level (rate) is limited mostly to the p-side (Red) and n-side (Blue) active layers (QWs) with corresponding colors emission; respectively, and totally missing the dominance of the Green color primary of the gamut at any injection level, thus unable to achieve full coverage of the standard RGB color gamut. As can be seen from FIG. 5B, doping the barriers between the active layers of the semiconductor light emitting diode structure according to conventional approaches without IBLs causes the light emission to be dominated by the Green and Blue emission active layers (QWs) at the low and high injection levels, respectively, and causes the dominance of the Red color primary of the gamut to be missing at any injection level. It is therefore not possible to achieve full coverage of the standard RGB color gamut. As can be seen from FIGS. 5C and 5D, with IBLs incorporated into the active region of the LED structure, the color emission trajectory with the increase in the injection level (rate) fully covers the standard RGB color gamut.

Selection of the composition of intermediate carrier blocking layers (IBLs) will now be described with reference to FIGS. 7A-7F. In this regard, FIGS. 7A-7F illustrate the sensitivity of MQW injection to the design of the IBLs. FIGS. 7A-7F show the CIE chromaticity diagram of an RGB-IBL LED similar to that of RGB-IBL LED 300 in FIG. 3, except with design parameters of one of the IBLs modified. In FIGS. 7A-7F, similar to FIGS. 5A-5D, the circle markers indicate the starting point at the lowest injection, the square markers correspond to the highest injection level, the triangles mark the injection level, and the crosses ("X") indicate the primary colors of a standard RGB gamut (crosses 702, 706, 710, 714, 718, 722 indicate red; crosses 701, 705, 709, 713, 717, 721 indicate green; crosses 703, 707, 711, 715, 719, 723 indicate blue.)

FIGS. 7A-7C illustrate sensitivity of color control to the choice of an intermediate blocking layer placed between Green and Red active layers (QWs), herein referred to as IBL2, as affected by its material composition. In FIGS. 7A-7C, an intermediate blocking layer placed between Blue and Green QWs herein referred to as IBL1, is absent and the band-gap of IBL2 located between Green and Red QWs is increased as affected by increasing the Aluminum concentration within its composition systematically from that of FIG. 7A to that of FIG. 7C. FIGS. 7A-7C thus show how the IBL2 band-gap as affected by its material composition is used to control Red-Green color balance.

FIGS. 7D-7F illustrate how the band-gap of the IBL1 as affected by its material composition is used to adjust the LED output Green-Blue color balance at a specific injection level. In FIGS. 7D-7F, IBL2 design is fixed (as in RGB-IBL LED 300 of FIG. 3) while Aluminum concentration in an undoped IBL1 is increased systematically from that of subplot D to that of subplot F. FIGS. 7D-7F thus show how IBL1 band-gap as affected by its material composition can be used to control Green-Blue color balance at a specified nominal injection of 10 A/cm$^2$ indicated by triangle marker in subplots D-F. In an embodiment described below, this feature will be used to adjust the white-light LED emission to the maximum efficiency point.

Selection of the doping amount of an intermediate blocking layer (IBL1) placed between Blue and Green active layers will now be discussed with reference to FIGS. 8A-8D and FIGS. 9A-9D. In this regard, FIGS. 8A-8D and FIGS. 9A-9D further illustrate the sensitivity of MQW injection to the design of IBLs using the process of RGB-IBL LED structure design as an illustrative example. FIGS. 8A-8D illustrate CIE diagrams for an RGB-IBL LED with selected and fixed IBL1 and IBL2 compositions and with varying level of IBL1 doping. FIGS. 9A-9D present the corresponding injection dependencies of emission chromaticity coordinates. In this regard, the embodiments of FIGS. 9A-9D correspond, respectively, to the embodiments of subplots FIGS. 8A-8D. As can be seen from FIGS. 8A-8D, either n or p doping of IBL1 would affect the color balance at the Red-Green or the Green-Blue sides, respectively. In the structure of an RGB-IBL designed according to the embodiment of FIG. 8C (also the embodiment in FIG. 5C), IBL1 is undoped in order to achieve improved coverage of a target color gamut represented by the cross marks in FIGS. 8A-8D, where crosses 802, 806, 810, 814 indicate red, crosses 801, 805, 809, 813 indicate green and crosses 806, 807, 811, 815 indicate Blue. In FIGS. 8A-8D, similar to the plots in FIGS. 5A-5D, the circle markers indicate the starting point at the lowest injection, the square markers correspond to the highest injection level, the triangles mark the injection level. In FIG. 9, lines 903, 906, 909, 912 indicate red; lines 902, 905, 908, 911 indicate green; and lines 901, 904, 907, 910 indicate blue.

Selection of the doping amount of an intermediate blocking layer (IBL2) placed between Green and Red active layers will now be discussed with reference to FIGS. 10A-10D. FIGS. 10A-10D further illustrate the sensitivity of MQW injection to the design of IBLs using the process of RGB-IBL LED structure design as an illustrative example. In this regard, FIGS. 10A-10D present CIE diagrams for RGB-IBL LED with selected and fixed IBL1 and IBL2 compositions and with varying level of p-doping in IBL2. As can be seen from FIGS. 10A-10D, the most extended coverage of the desired color gamut through varying the carrier injection level (rate) is established when IBL2 p-doping is set at the level shown in FIG. 10C, below or above which the gamut coverage does not sufficiently extend across the desired RGB standard color gamut. In the structure presented in FIG. 4C, the doping level of IBL2 is Na=1.5×10$^{18}$ cm$^{-3}$ in order to achieve the most extended coverage of a target color gamut represented by the Red, Green and Blue "X"-marks in FIGS. 10A-10D in which crosses 1002, 1006, 1010, 1014 indicate red; crosses 1001, 1005, 1009, 1013 indicate green; and crosses 1003, 1007, 1011, 1015 indicate blue.

Figure 11A:
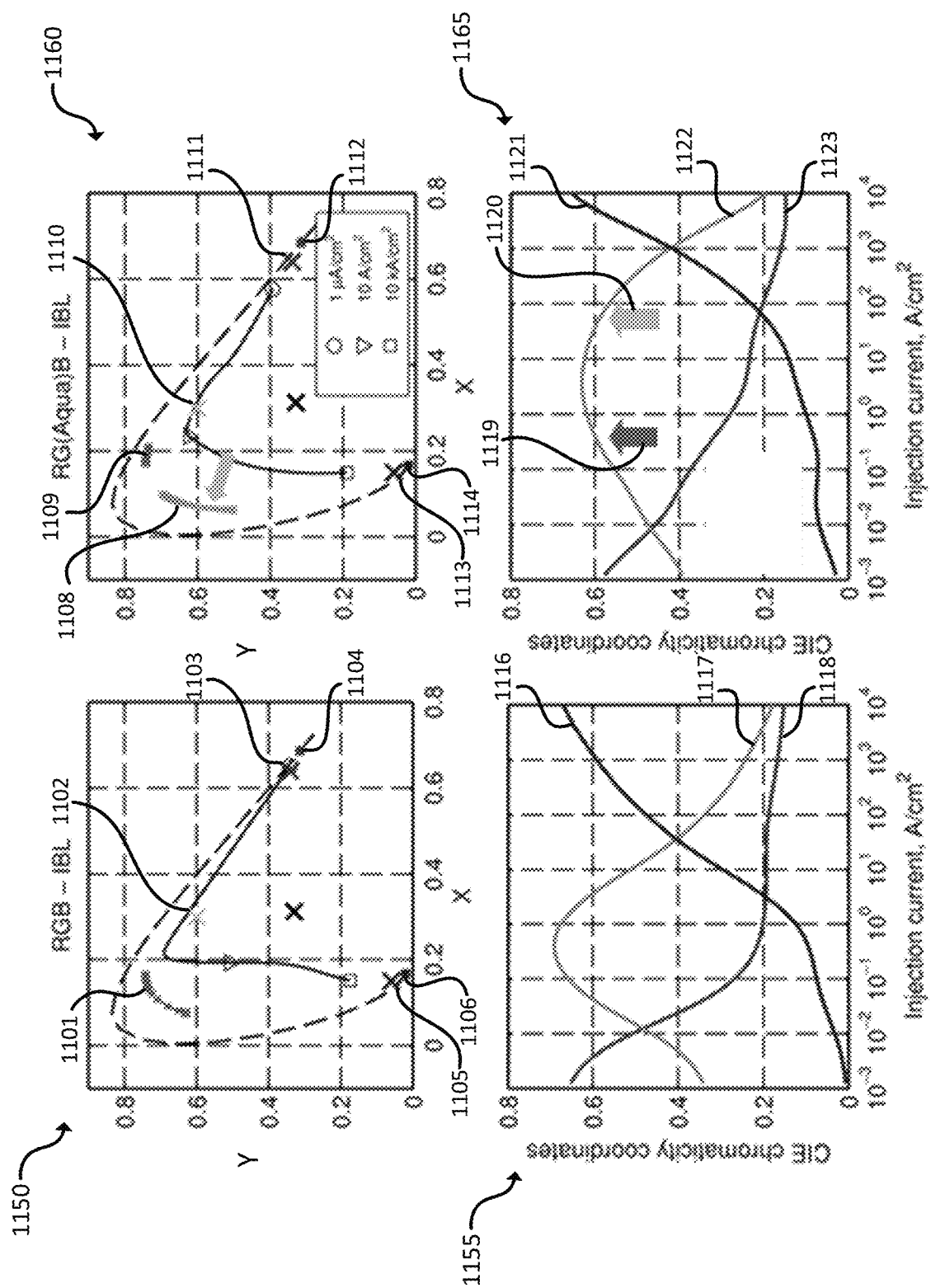
FIG. 11A illustrates an embodiment in which color emission is extended beyond the standard RGB palette by including an additional aquamarine-emitting QW and using intermediate blocking layers.

An embodiment will now be discussed with reference to FIG. 11A in which additional multi-color QWs are included in the active region. As illustrated in FIG. 11A, the RGB gamut is controlled by including additional QWs and re-designing the intermediate carrier blocking layers (IBLs). In this embodiment, indicated by the RG(Aqua)B-IBL column in FIG. 11A (plots 1160 and 1165), instead of using one green-emitting QW with nominal emission wavelength 525 nm, two QWs including a green-emitting QW with nominal emission wavelength 531 nm and an aquamarine-emitting QW with nominal emission wavelength 512 nm are used, separated by an additional intermediate carrier blocking layer (IBL3). The RGB-IBL column of FIG. 11A (plots 1150 and 1155) corresponds to the embodiment of FIG. 3, in which the structure does not include an aquamarine-emitting QW.

Table 2A compares the designed IBLs in an LED structure without an aquamarine-emitting QW (RGB-IBL LED) and in an LED structure according to this embodiment including an aquamarine-emitting QW (RGAB-IBL LED). FIG. 11A also shows the CIE characteristics of each active QW indicated by corresponding color. In this regard, lines 1118 and 1123, crosses 1103 and 1111 and dots 1104 and 1112 indicate red; lines 1117 and 1122, arrow 1119, crosses 1102 and 1110, and areas 1101 and 1109 indicate green; lines 1116 and 1121, arrow 1120, crosses 1105 and 1113, dots 1106 and 1114, and area 1108 indicate blue. In FIG. 11A, the RGAB-IBL structure is designed with strong blue-shift in aquamarine QW emission to extend the green-emission range beyond the nominal injection level of 10 A/cm$^2$.

TABLE 2A

| IBL-LED structures and IBL positions | | IBL composition | IBL donors ($10^{17}$ cm$^{-3}$) | IBL acceptors ($10^{18}$ cm$^{-3}$) |
|---|---|---|---|---|
| RGB-IBL LED | RGAB-IBL LED | | | |
| IBL1 (Blue-Green) | IBL1 (Blue-Aqua) | Al$_{0.05}$Ga$_{0.95}$N | 8.0 | 0.0 |
| | | Al$_{0.07}$Ga$_{0.93}$N | 0.0 | 0.0 |
| IBL2 (Green-Red) | IBL2 (Aqua-Green) | Al$_{0.20}$Ga$_{0.80}$N | 0.0 | 1.0 |
| | | Al$_{0.20}$Ga$_{0.80}$N | 0.0 | 1.5 |
| | IBL3 (Green-Red) | Al$_{0.02}$Ga$_{0.98}$N | 0.0 | 0.7 |

Figure 11B:
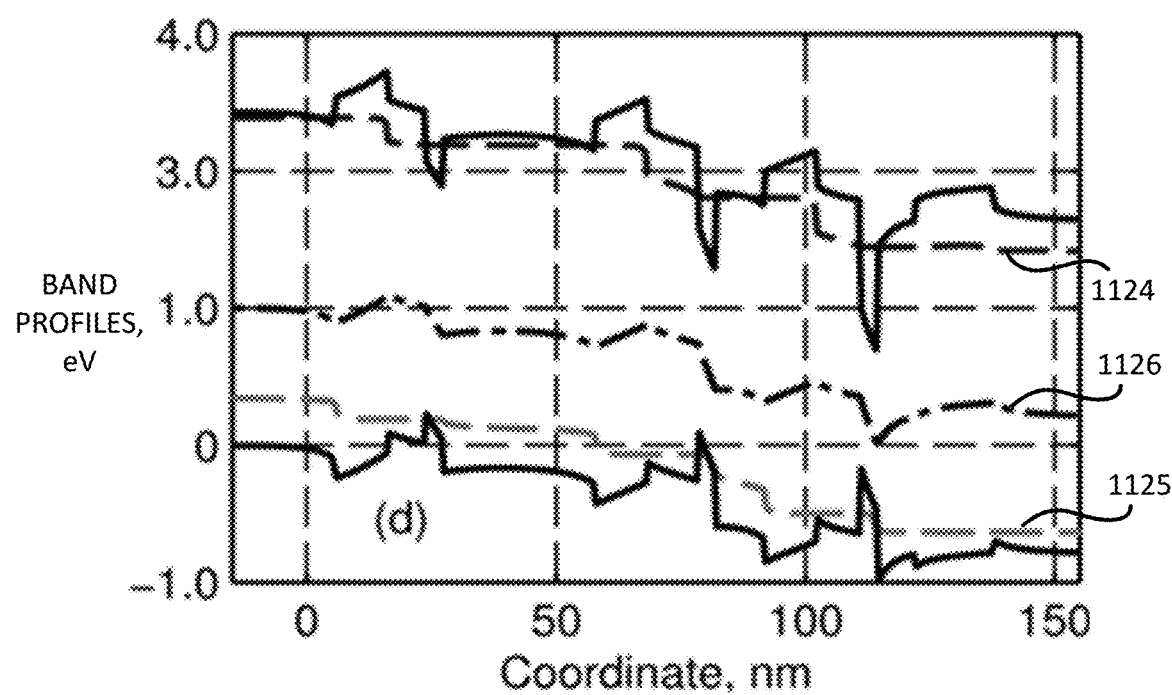
FIG. 11B-11C relate to an embodiment in which an additional intermediate carrier blocking layer is incorporated to reduce the full color control current injection range.

Selection of carrier injection current will now be described with reference to FIGS. 11B-C. In the embodiment illustrated by FIGS. 11B-C, an additional intermediate carrier blocking layer (IBL0) in front (n-side) of the blue-emitting QW has been incorporated into an RGB-IBL LED structure disclosed herein, and the other intermediate blocking layers (IBL1 and IBL2) and barrier layers of the structure's active region are re-designed. Accordingly, it is possible to improve the full color current injection range of the RGB-IBL LED structure. FIG. 11B illustrates the band profile the RGB-IBL LED structure of this embodiment. Similar to FIG. 4, the dashed lines in FIG. 11B show the quasi-Fermi levels for electrons (line 1124) and holes (line 1125). The dashed-dotted line (line 1126) in FIG. 11B indicates the internal potential distribution inside the active region.

Figure 11C:
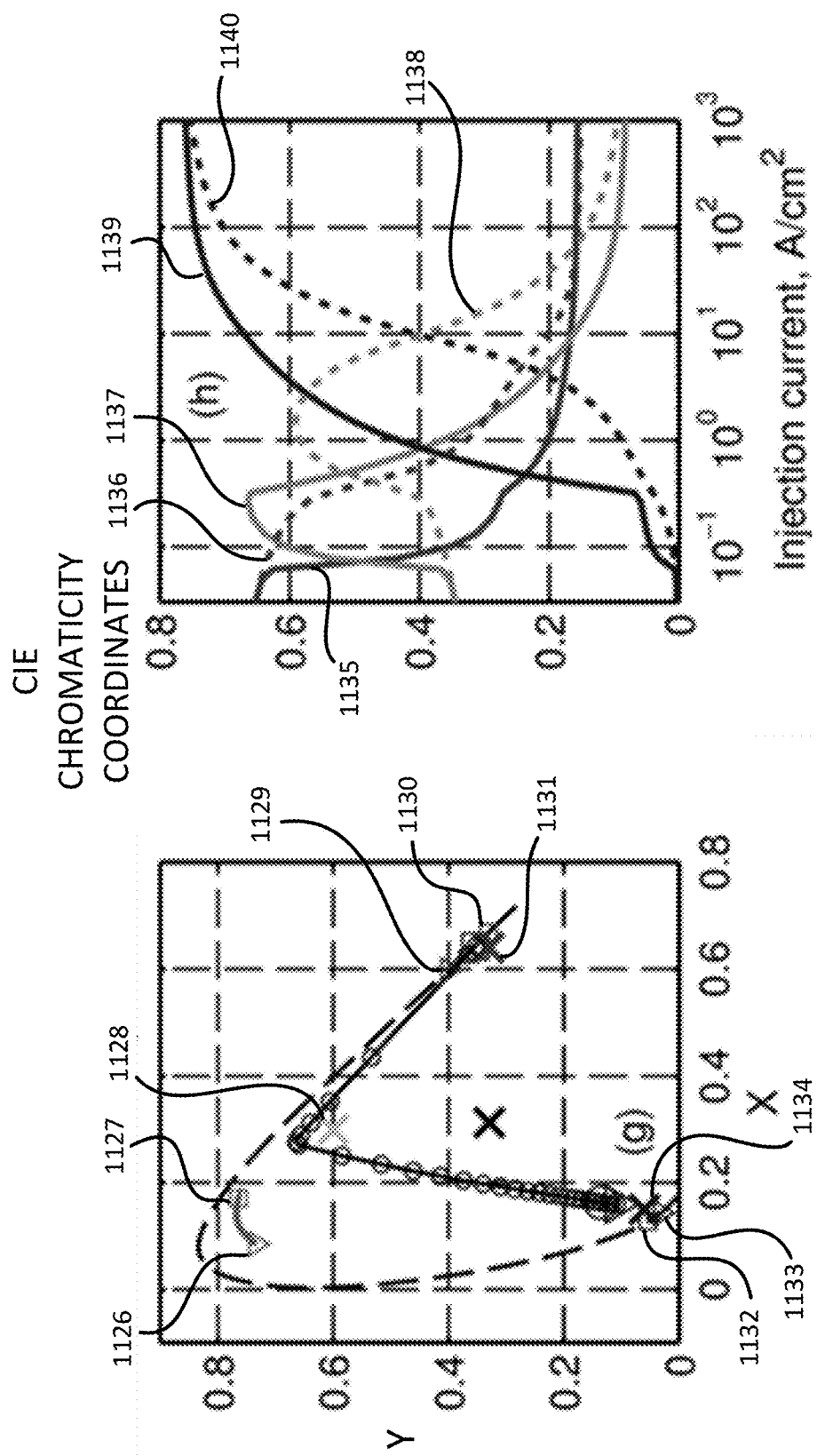

Table 2B provides example parameters for design of the active region according to the embodiment of FIGS. 11B-C. As shown in Table 2B, besides the addition of IBL0 at the n-side of the structure, re-designing the active region of the light emitting layout structure includes: (i) adding IBL0 with an Aluminum content at 22% accompanied by light Si doping at 7×10$^{17}$ cm$^{-3}$, (ii) increasing the barrier separation between B-QW and G-QW layers accompanied by Mg doping at 1×10$^{17}$ cm$^{-3}$, (iii) increasing the Aluminum content in IBL1 up to 23% accompanied by light Mg doping at $0.3 \times 10^{17}$ cm$^{-3}$, and (iv) increasing the Aluminum content in IBL2 up to 25% accompanied by Mg doping at $5 \times 10^{17}$ cm$^{-3}$.

FIG. 11C shows the injection dependence of the light emission gamut CIE RGB chromaticity coordinates of the RGB-IBL LED structure example of this embodiment. In FIG. 11C, triangle 1126 indicates green, square 1127 indicates green and cross 1128 indicates green. Also, triangle 1129 indicates red, square 1130 indicates red and the cross 1131 indicates red. Square 1132 indicates blue, triangle 1133 indicates blue and cross 1134 indicates blue. The dotted lines (line 1136 indicating Red; line 1138 indicating Green; line 1140 indicating Blue) in FIG. 11C show the emission gamut of the RGB-IBL LED structure with the additional IBL0 but without re-designing of the remaining structure. The solid lines (line 1135 indicating Red; line 1137 indicating Green; line 1139 indicating Blue) in FIG. 11C show the emission gamut of the RGB-IBL LED structure with the additional IBL0 and re-designing of the remaining structure. As can be seen from the solid lines FIG. 11C, the RGB-IBL LED structure with the additional IBL0 and re-designed structure of this embodiment fully covers the standard RGB gamut within an injection current ranging from 20 mA/cm$^2$ to 50 A/cm$^2$, which is substantially narrower than the examples of the previous embodiments.

An additional benefit of incorporating the intermediate carrier blocking layers (IBLs) into the active region of a multi-color light-emitting diode structure (such as active region 330 of the structure 300 in FIG. 3) is that the IBLs also act as intermediate strain-compensation layers. As such, in addition to balancing the carrier transport across the active region, incorporation of the IBLs also minimizes the crystalline strain across a multiple band gap active region (such as active region 330 of light-emitting diode structure 300). As a result, incorporation of the IBLs also promotes higher indium intake into nitride-based (InGaN) optically active layers (such as optically active layers 331 of the multi-color light-emitting diode structure 300), thus enabling the epitaxial growth of optically active layers having long wavelength light emission ranging from Amber (615-nm) to Red (625-nm) within the active region of the multi-color light-emitting diode structure. Thus, incorporating the intermediate carrier blocking layers (IBLs) also enables production of a color-tunable nitride-based light-emitting diode structure that has current injection controllable light emission across the visible light spectrum.

TABLE 2B

| Layer | Width nm | Composition | Donors ($10^{17}$ cm$^{-3}$) | Acceptors ($10^{17}$ cm$^{-3}$) |
| --- | --- | --- | --- | --- |
| P-Layer | 250 | GaN | 0.0 | 100.0 |
| EBL | 15.0 | Al$_{0.20}$Ga$_{0.80}$N | 0.0 | 500 |
| Barrier | 10.0 | GaN | 0.0 | 5.0 |
| Red QW | 3.0 | Ga$_{0.65}$In$_{0.35}$N | 0.0 | 0.0 |
| Barrier | 10 | GaN | 0.0 | 0.0 |
| IBL2 (Green-Red) | 10.0 | Al$_{0.25}$Ga$_{0.75}$N | 0.0 | 5.0 |
| Barrier | 10 | GaN | 0.0 | 0.0 |
| Green QW | 3.0 | Ga$_{0.75}$In$_{0.25}$N | 0.0 | 0.0 |
| Barrier | 10.0 | GaN | 0.0 | 0.0 |
| IBL1 (Blue-Green) | 10.0 | Al$_{0.23}$Ga$_{0.77}$N | 0.0 | 0.3 |
| Barrier | 25.0 | GaN | 0.0 | 1.0 |
| Blue QW | 3.0 | Ga$_{0.85}$In$_{0.15}$N | 0.0 | 0.0 |
| Barrier | 10.0 | GaN | 0.0 | 0.0 |
| IBL0 (Blue) | 10 | Al$_{0.22}$Ga$_{0.78}$N | 7.0 | 0.0 |
| Barrier | 10.0 | GaN | 1.0 | 0.0 |
| N-Layer | 500 | GaN | 10.0 | 0.0 |

FIG. 12A provides a comparison of the variable-color emission spectra obtained from simulation using an RGB-IBL LED (the RGB-IBL column of FIG. 11A) with experimental electroluminescence spectra obtained from three-color Amber-Green-Blue-IBL LED epitaxially grown according to the RG(Aqua)B-IBL column of FIG. 11A. In the simulated spectra (plot 1200) the voltage drop across the active region changes from 3.0V to 3.7V with 20 mV step. In plot 1200, moving from the line 1201 towards line 1202 on the plot, line 1201 indicates purple, the next several lines indicate blue, then green, then yellow, then orange, then red, then repeats again starting at purple until line 1202 indicates red. In the experimental data set (plot 1220) the legend indicates total LED injection current. In the legend of plot 1220, 4 mA indicates red, 7 mA indicates light green, 11 mA indicates dark blue, 31 mA indicates light blue, 61 mA indicates purple, 101 mA indicates dark blue, 151 mA indicates light blue, 201 mA indicates dark blue, 251 mA indicates light blue, 301 mA indicates red, 340 mA indicates dark green, 350 mA indicates light green, and 353 mA indicates orange. Referring to plot 1220, line 1222 corresponds to 4 mA indicating red, and line 1221 corresponds to 353 mA indicating orange. Moving from line 1222 up towards line 1221, the intermediate lines correspond, in order, to the legend of plot 1220. Accordingly, the line above line 1222 corresponds to 7 mA indicating light green, and the next line up corresponds to 11 mA indicating dark blue, and so on.

Figure 12B:
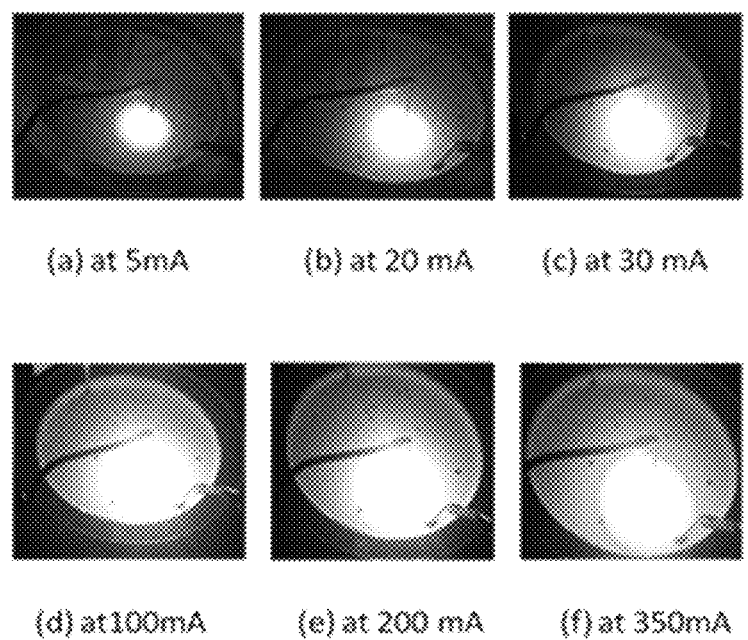
FIG. 12B is a view for explaining output emission colors at different injection currents obtained from a monolithic color-tunable nitride-based three-color RGB-IBL LED epitaxially grown according to example embodiments disclosed herein.
Figure 12C:
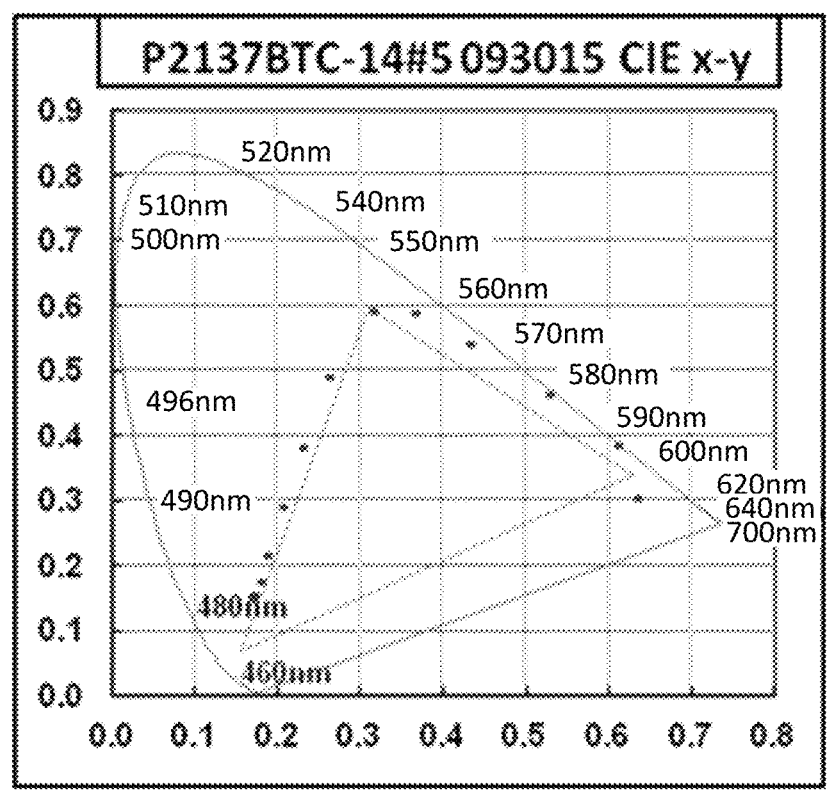
FIG. 12C illustrates emission colors gamut coverage at different injection currents obtained from a monolithic color-tunable nitride-based three-color RGB-IBL LED epitaxially grown according to example embodiments disclosed herein.

FIGS. 12B and 12C provide the variable-color emission spectra obtained from an RGB-IBL LED designed in accordance with the disclosure herein and epitaxially grown using III-nitride. In order to achieve the full color gamut demonstrated in FIGS. 12B and 12C the epitaxially grown RGB-IBL LED structure includes the incorporation of an IBL in between QWs with the same emission wavelength. Specifically, the variable-color emission spectra obtained from the epitaxially grown RGB-IBL LED provided in FIGS. 12B and 12C incorporated three Blue emission QWs and the Blue-Green IBL1 then two Green emission QWs separated by an additional IBL, designated as IBL1.5, followed by the Red emission QW which is separated from the second Green emission QW by IBL2. The composition and doping of the three IBLs in this epitaxially grown RGB-IBL LED was selected as described above to achieve the color gamut coverage at the injection range provided in FIGS. 12B and 12C. In FIG. 12B, (a) at 5 mA demonstrates emission of red light, (b) at 20 mA demonstrates emission of orange light, (c) at 30 mA demonstrates emission of yellow light, (d) at 100 mA demonstrates emission of light green light, (e) at 200 mA demonstrates emission of light blue light, and (f) at 350 mA demonstrates emission of blue light. In FIG. 12C, 700 nm and 640 nm indicate red; 620 nm indicates red-orange; 600 nm indicates orange; 590 nm indicates light orange; 580 nm indicates light orange; 570 nm indicates yellow; 560 nm and 540 nm indicate light green; 520 nm, 510 nm and 500 nm indicate green; 496 nm indicates blue; 480 nm indicates light blue; and 480 nm and 460 nm indicate dark blue.

Figure 13:
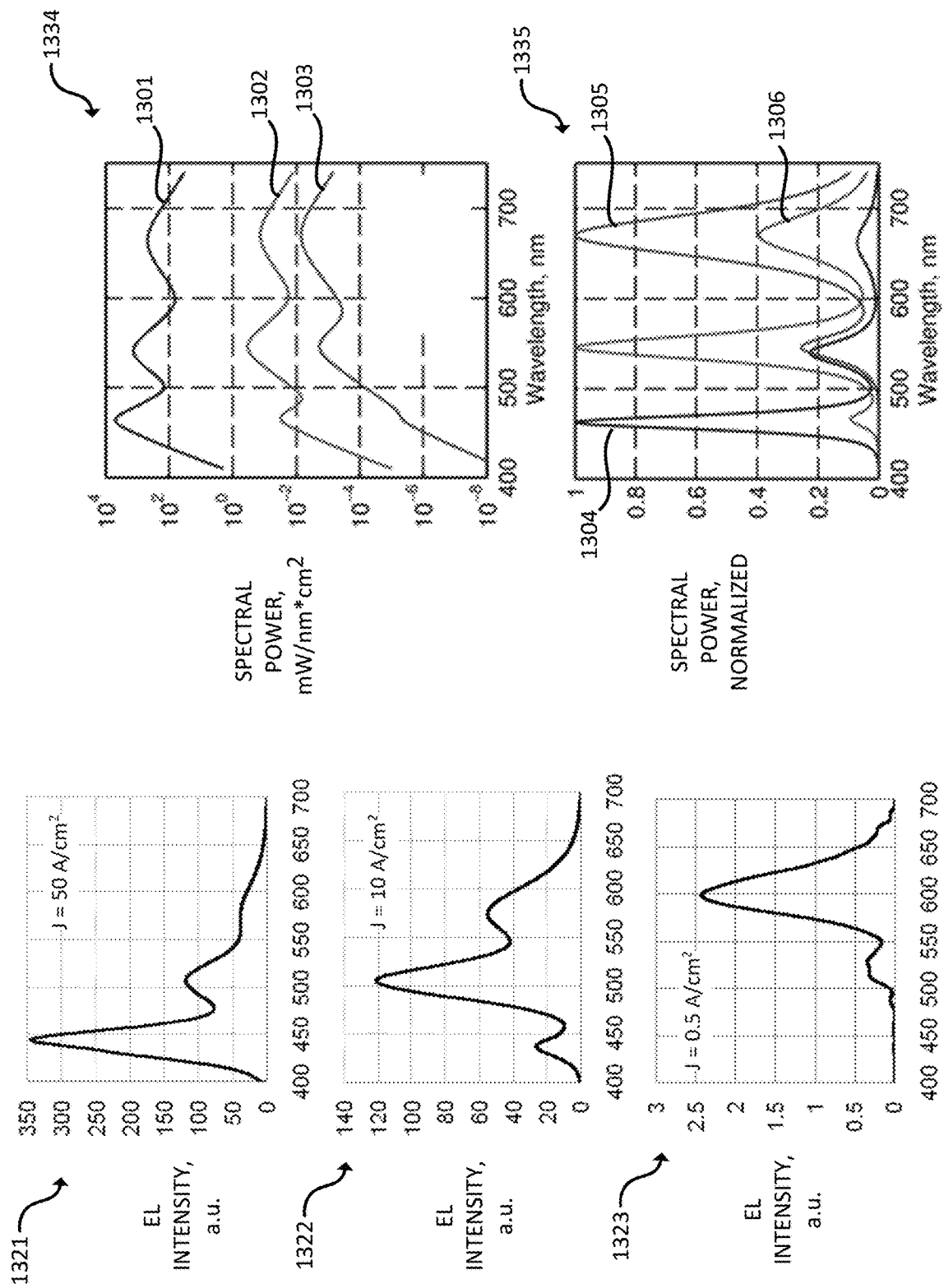
FIG. 13 illustrates experimental electroluminescence spectra of an monolithic color-tunable nitride-based three-color RGB-IBL LED such as structure 300 of FIG. 3 grown according to example embodiments disclosed herein and illustrates a detailed comparison with simulation results.

FIG. 13 further specifies the experimental electroluminescence spectra of the monolithic color-tunable nitride-based three-color RGB-IBL LED 300 of FIG. 3 designed and grown according to the disclosure herein and provides a more detailed comparison with simulation results. Plots 1321-1323 in FIG. 13 show the EL spectra measured at room temperature at a low, moderate, and high injection current density. For low current density of about 0.5 A/cm$^2$ (plot 1323), the light emission is mainly in red color with wavelength ranging roughly from 560 to 650 nm and with a full width at half maximum (FWHM) around 50 nm. For moderate current density of about 10 A/cm² (plot 1322), the light emission is mainly in green color with wavelength ranging roughly from 480 to 540 nm and with a full width at half maximum (FWHM) around 45 nm. For current density of about 50 A/cm² (plot 1321), the light emission is mainly in blue color with wavelength ranging roughly from 420 to 475 nm and with a full width at half maximum (FWHM) around 35 nm. Plots 1334-1335 show corresponding results for spectral emission power at three voltage bias values (in Volts). In plot 1334, line 1301 indicates a voltage bias value of 3.46 Volts, line 1302 indicates a voltage bias value of 3.16 Volts, and line 1303 indicates a voltage bias value of 2.98 Volts. Plot 1335 presents the results on a normalized scale. In plot 1305, line 1305 indicates red, line 1306 indicates green and line 1304 indicates blue.

In the preceding embodiments multiplicity of intermediate carrier blocking layers (IBLs) are incorporated within the optically active region of the RGB-IBL LED. As described, in some of these embodiments the IBLs separate regions of active layers incorporating one or more QWs having a specific wavelength emission. Also in some of these embodiments an IBL separates active layers incorporating QWs having the same wavelength emission. Yet in other embodiments of this invention an IBL is incorporated at n-side of the optically active region of the RGB-IBL LED. In all of these embodiments the IBLs composition and doping are selected and designed as described in the preceding discussion to enable controllable (or tunable) color emission covering wide color gamut over a given carrier injection (I,V) range. The general design criteria of the IBLs composition and doping in these embodiments include one or more of the following: (1) the conduction band (CB) energy level of the IBLs should be higher than the CB edge of the optically active region and progressively increasing from the n-side toward the p-side of the structure; and (2) the valence band (VB) energy level of the IBLs should be lower than the VB edge of the optically active region and progressively decreasing from the n-side toward the p-side of the structure.

According to the embodiments disclosed above, multi-color semiconductor light emitting structures (for example, a color-tunable RGB-IBL LED device) are designed by selection of one or more of the following design parameters of the semiconductor light-emitting structure: (1) the band-gaps of the active layers QWs being selected to achieve light emission over a desired color emission gamut; (2) the number of active layers QWs with a band-gap corresponding to the light emission at a given wavelength being selected to include a desired color emission primaries into the device light emission gamut at a desired relative optical emission power for each color; (3) the multiplicity of IBLs with optimized material composition and doping levels being incorporated into the active region of the light emitting device in order to enable carrier injection rate control of the device light emission color within the desired gamut; (4) the multiplicity of IBLs with optimized material composition and doping levels being incorporated into the active region of the light emitting device in order to enable control of the device light emission color within a given carrier injection range; and (5) the band-gap of the multiplicity of active layers QWs corresponding to the light emission at a given wavelength being selected to provide a wide gamut color emission.

Figure 14:
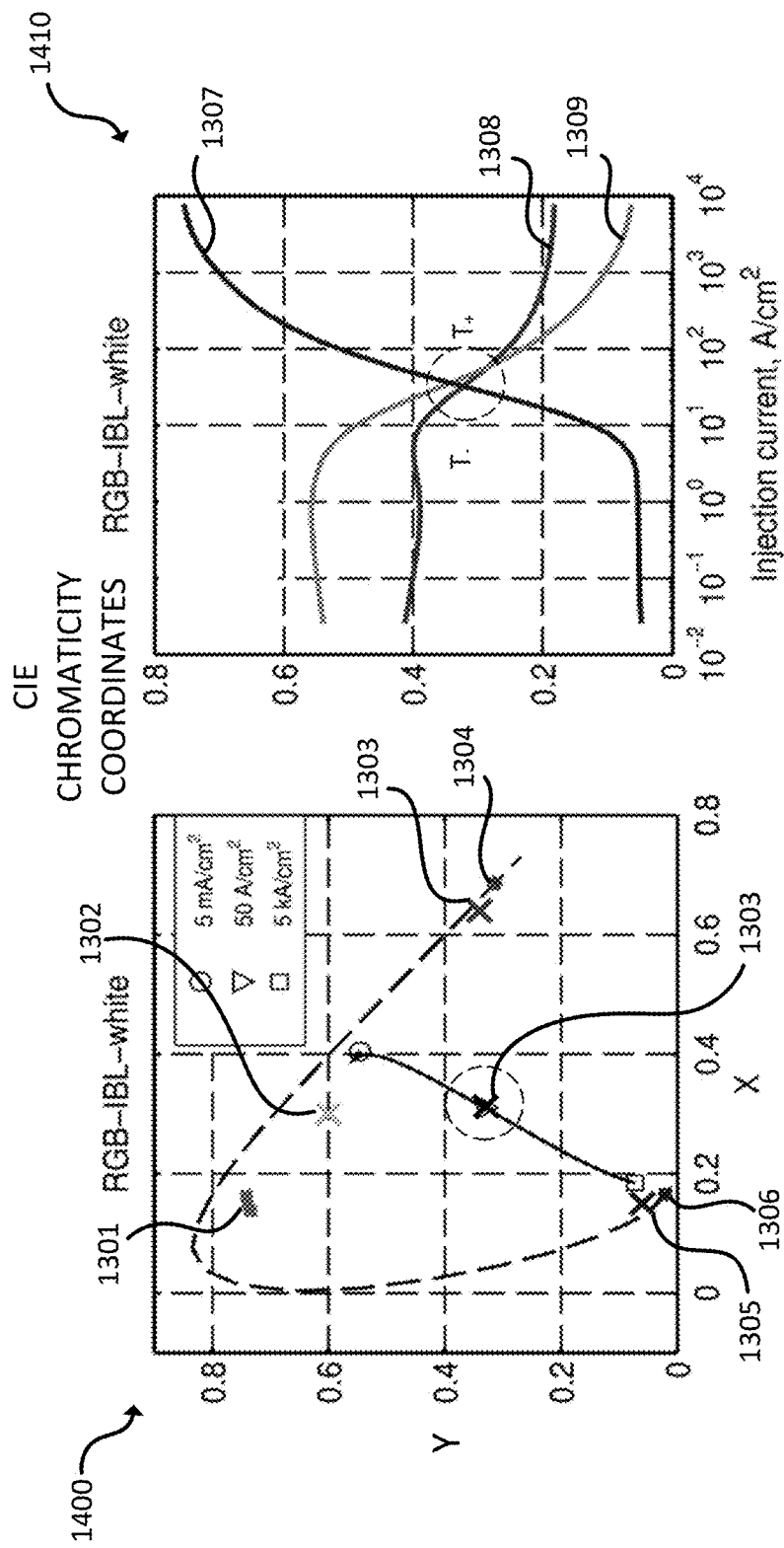
FIG. 14 illustrates a CIE diagram and injection dependence of emission chromaticity coordinates calculated for an RGB-IBL LED such as structure 300 of FIG. 3 designed to produce white-light emission at maximum LED efficiency point according to example embodiments disclosed herein.

Several examples will now be described with reference to FIGS. 14-16 in which the design parameters of the semiconductor light-emitting structure are selected to provide for various applications. FIG. 14 illustrates an embodiment in which the design parameters of the IBLs incorporated within a multi-color LED structure are selected to create a monolithic white LED with variable color temperature. FIG. 14 shows CIE chromaticity diagram 1400 and injection dependence of emission chromaticity coordinates 1410. In the embodiment of FIG. 14, the design parameters of an RGB-IBL-White LED structure have been selected to produce white-light emission at the maximum LED efficiency point at an injection current density of 50 A/cm² (indicated by the inverted triangle in 1400 of FIG. 14) at the white point (marked by the cross 1303 in plot 1400 of FIG. 14) of the color gamut formed by emission color primaries of the RGB-IBL structure active layers QWs. In plot 1400 of FIG. 14, cross 1303 and dot 1304 indicate red; cross 1302 and area 1301 indicate green; cross 1305 and dot 1306 indicate blue. In plot 1410 of FIG. 14, line 1308 indicates red, line 1309 indicates green and line 1307 indicates blue.

Table 3 compares the IBLs designed for the white-light emitting RGB-IBL-White LED with IBLs designed for the RGB-IBL LED 300 of FIG. 3 (also presented in FIG. 4C and in FIG. 5C.)

TABLE 3

| IBL-LED structures and IBL positions | | IBL composition | IBL donors | IBL acceptors |
|---|---|---|---|---|
| RGB-IBL LED | RGB-IBL-White LED | | ($10^{17}$ cm$^{-3}$) | ($10^{18}$ cm$^{-3}$) |
| | IBL (Blue-Green) | $Al_{0.24}Ga_{0.76}N$ | 3.8 | 0.0 |
| IBL (Blue-Green) | | $Al_{0.07}Ga_{0.93}N$ | 0.0 | 0.0 |
| | IBL (Green-Red) | $Al_{0.06}Ga_{0.94}N$ | 2.8 | 0.0 |
| IBL (Green-Red) | | $Al_{0.20}Ga_{0.80}N$ | 0.0 | 1.5 |

Plot 1410 of FIG. 14 shows the injection dependence of emission chromaticity coordinates of the white-light emitting RGB-IBL-White LED. In this embodiment, the design parameters of the RGB-IBL-White LED structure are selected to create white light emission of a given color temperature, for example 6500° K, at the nominal injection current density of 50 A/cm². As shown in plot 1410 of FIG. 14, when the injection current is increased to a value higher than the nominal injection current density of 50 A/cm², the emitted white light will include higher level of relative intensity contribution from the Blue active layer QW, thus causing the emitted white light color temperature to correspondingly increase to a value $T_+$ higher than the temperature of the white light emitted at the nominal injection current density of 50 A/cm². Similarly, as shown in plot 1410 of FIG. 14, when the injection current is decreased to a value lower than the nominal injection current density of 50 A/cm², the emitted white light will include higher level of relative intensity contribution from the Green and Red active layers QWs, thus causing the emitted white light color temperature to correspondingly decrease to a value $T_-$ lower than the temperature of the white light emitted at the nominal injection current of 50 A/cm². The RGB-IBL-white LED structure design parameters are selected to create an injection current control range above and below the nominal injection current density that correspond to a desired white light emission temperature range around a nominal emitted white light temperature. For example, when a white light temperature of 6500° K is selected at the nominal injection current density of 50 A/cm², the RGB-IBL-white LED structure design parameters could also be designed to allow a range of white color temperature ranging from 2500° K to 8000° K, for example, when the device injection current is decreased or increased over a given range below and above, respectively, the nominal injection current density of 50 A/cm$^2$.

As can be seen from FIG. 14, design parameters are selected for IBLs that are incorporated within the active region of a multi-color LED structure to create a monolithic white LED device whose emitted white light temperature is changed by changing its current injection level. In the general lighting field of application, the controllable (or adjustable) white emission temperature monolithic white LED device can be used to create a solid state light bulb having a the controllable (adjustable) white emission temperature. In the display field of application, the controllable (adjustable) white emission temperature monolithic white-light emitting LED device can be used to create a solid state back light unit (BLU) for liquid crystal displays (LCD) or any other types of displays that require back illumination light such as quantum dots displays. One advantage of using such a monolithic white LED as a back light for displays is that its brightness as well as its white color temperature can be adjusted to match the display requirements without sacrificing the dynamic range of the displayed images. In that regard, in conventional white back lit displays, the backlight color temperature, and often its intensity, are typically fixed and the displayed image brightness or hue are adjusted by adjusting the displayed image pixels RGB values; an approach that typically results in a reduction of the displayed image dynamic range since a portion is being used to adjust the displayed image brightness and hue rather than being used to express the grayscale value of each pixel color. A display BLU that uses the controllable (adjustable) white emission temperature monolithic white-light emitting LED device can be used to alleviate these limitations and thus enable high dynamic range (HDR) displays.

Figure 15:
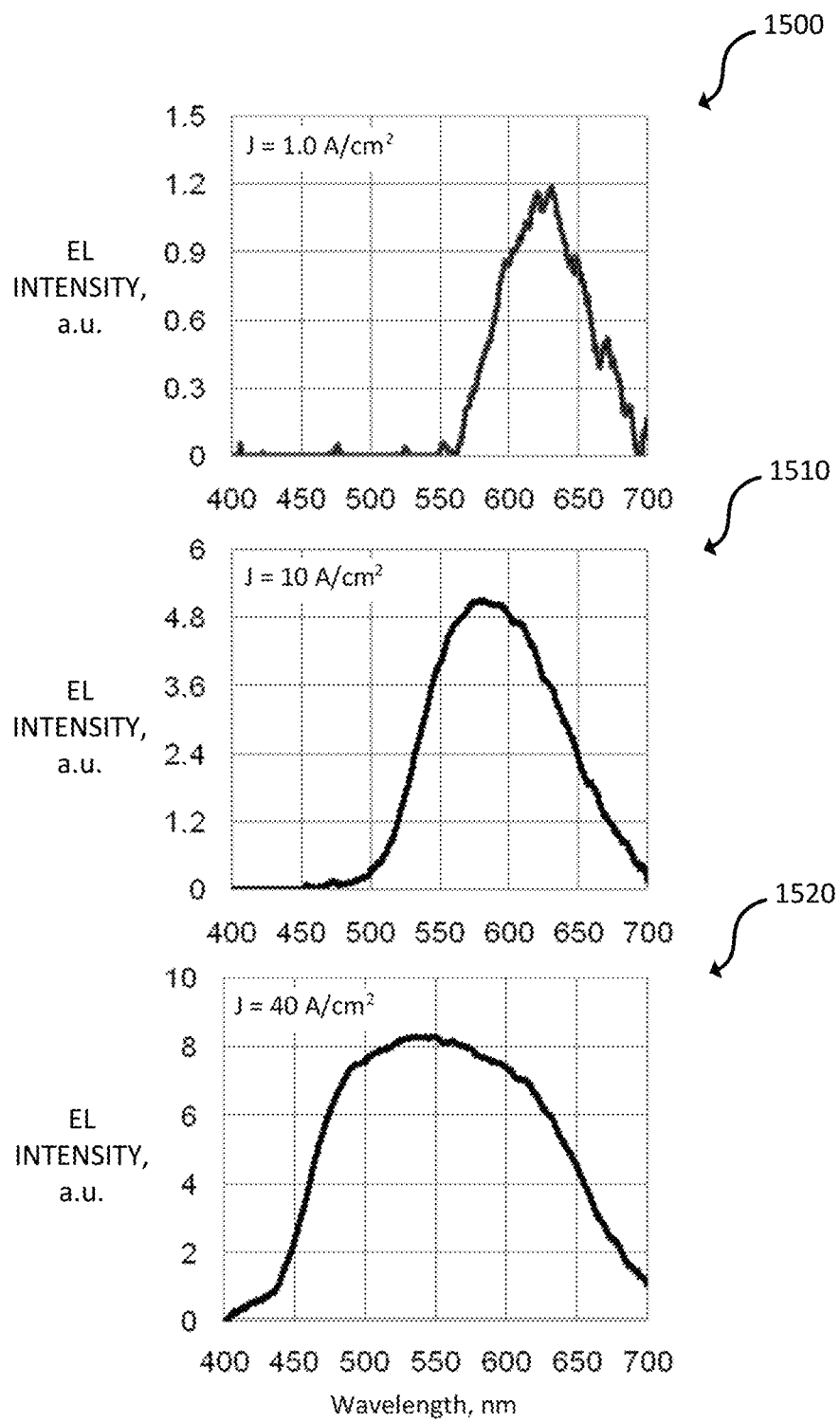
FIG. 15 illustrates the experimental electroluminescence spectra of a monolithic broadband visible light-emitting nitride-based RGB-IBL LED such as structure 300 of FIG. 3 designed and grown according to example embodiments disclosed herein.

FIG. 15 shows the electroluminescence spectra of the monolithic broadband visible light-emitting nitride-based RGB-IBL LED 300 of FIG. 3 epitaxially grown and designed according to the disclosure herein. Plot 1500 of FIG. 15 illustrates an EL spectrum at a driving current density of about 1 A/cm$^2$. The light emission is mainly in red band with wavelength range roughly from 560 to 680 nm and a full width at half maximum (FWHM) of 70 nm. Plot 1510 of FIG. 15 illustrates the EL spectrum at a medium driving current density of about 10 A/cm$^2$. The light emission is mainly in a combined red and green band with wavelength range roughly from 500 to 690 nm and a full width at half maximum (FWHM) of 120 nm. Plot 1520 of FIG. 15 illustrates the EL spectrum at injection current density of about 40 A/cm$^2$. The light is emitted in a combined red, green and blue bands with wavelength spanning roughly from 440 to 700 nm and a full width at half maximum (FWHM) of 190 nm. As can be seen from FIG. 15, design parameters are selected for IBLs that are incorporated within the active region of a multi-color LED structure to create a monolithic white LED device having a broadband white light emission.

Figure 16:
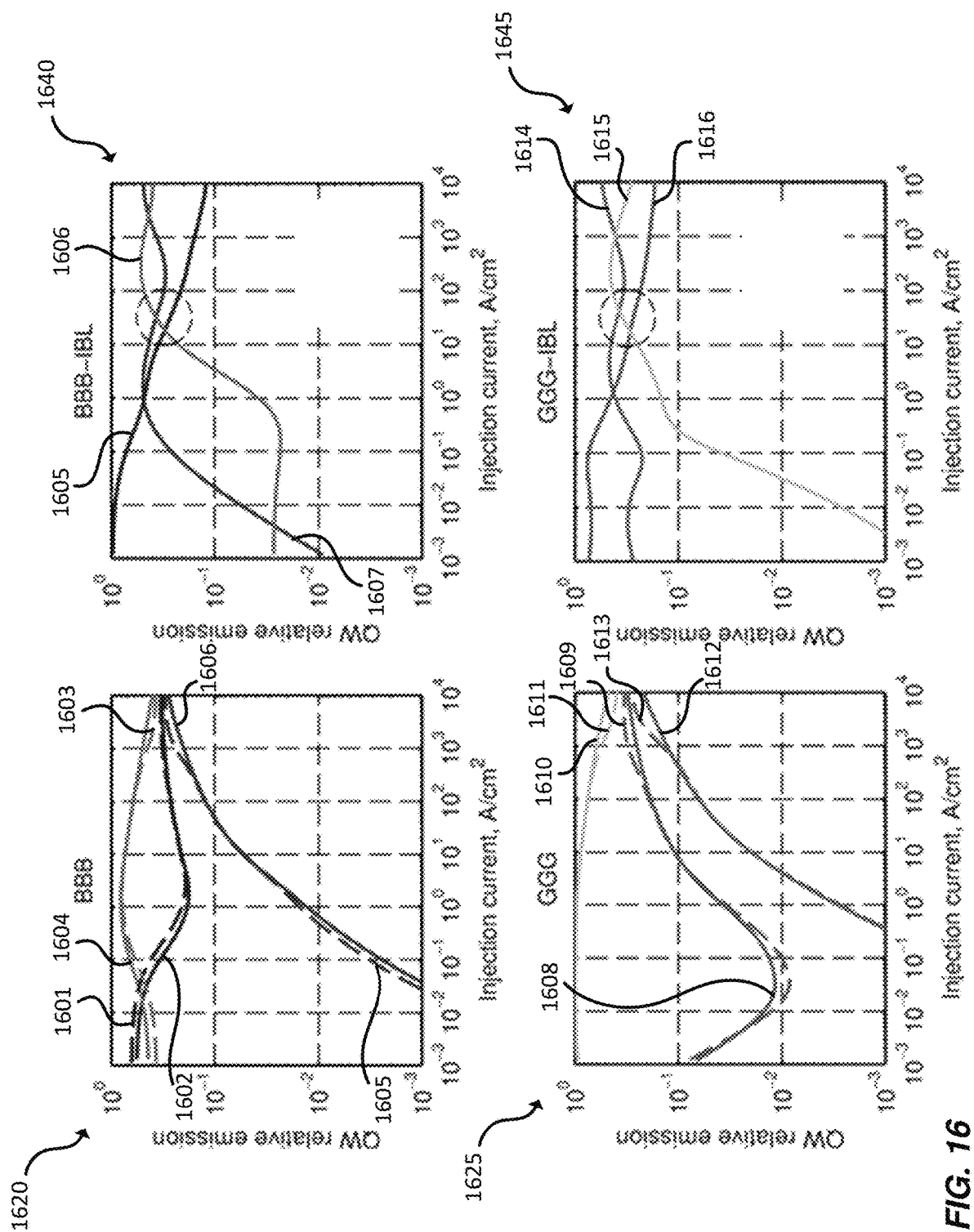
FIG. 16 illustrates a comparison of calculated emission characteristics of monochromatic MQW LEDs designed according to a conventional arrangement with a MQW-IBL LED designed to sustain uniformly populated active layers at maximum LED efficiency point according to example embodiments disclosed herein.

FIG. 16 illustrates an embodiment in which the design parameters of the IBLs incorporated within a monochromatic LED structure are selected to create uniformly populated active layers within the LED structure, thus alleviating the uneven and imbalanced population of active QWs that would unfavorably affect the device performance (for example, in terms of efficiency). FIG. 16 compares monochromatic blue-emitting (plots 1620 and 1640) and green-emitting (plots 1625 and 1645) MQW LEDs of the conventional structure of FIG. 1 (plots 1620 and 1625) with MQW-IBL LEDs designed according to the disclosure herein to sustain uniformly populated active layers in the MQW active region (plots 1640 and 1645). In each row, the subplots of FIG. 16 present distributions of optical emission power among active QWs ($P_i/\Sigma P_i$) in 3-QW LEDs according to the conventional structure of FIG. 1 (plots 1620 and 1625) and 3-QW IBL-LEDs with IBLs selected for uniform emission distribution at LED injection level corresponding to maximum LED internal quantum efficiency (IQE) achieved at injection current density of 50 A/cm$^2$ (plots 1640 and 1645). Conventional LED structures (such as FIG. 1) in plots 1620 and 1625 include structures without EBL (solid line 1602 indicating blue, solid line 1604 indicating light blue, solid line 1606 indicating purple, solid line 1608 indicating green, solid line 1610 indicating light green, and solid line 1612 indicating dark green) and with p-side EBL (dashed line 1601 indicating blue, dashed line 1603 indicating light blue, dashed line 1605 indicating purple, dashed line 1609 indicating green, dashed line 1611 indicating light green, dashed line 1613 indicating dark green) thus illustrating the insignificant effect of the EBL on MQW emission uniformity except at the highest injection levels where the whole LED internal quantum efficiency (IQE) already deteriorates. On the contrary, MQW-IBL LEDs reveal relatively uniform emission distribution in a wide range of practically important injection currents (marked by the circles in plots 1640 and 1645) well exceeding the initial optimization injection current of 50 A/cm$^2$. In plots 1640 and 1645 of FIG. 16, line 1605 indicates blue, line 1606 indicates light blue, line 1607 indicates purple, line 1614 indicates dark green, line 1615 indicates light green and line 1616 indicates green.

Table 4 compares the emission uniformity characteristics of conventional LEDs (without IBLs) and IBL-LEDs at nominal injection level of 50 A/cm$^2$ and shows IBL's Aluminum compositions and p-doping acceptor concentrations selected according to this embodiment.

TABLE 4

| LED structures | IBL Aluminum IBL1/IBL2, % | IBL acceptors IBL1/IBL2, 10$^{18}$ cm$^{-3}$ | $P_{min}/P_{max}$ at 50 A/cm$^2$ |
|---|---|---|---|
| BBB (prior art) | | | 0.15 |
| BBB-IBL | 20/10 | 0.5/1.0 | 0.59 |
| GGG (prior art) | | | 0.06 |
| GGG-IBL | 20/15 | 1.2/1.5 | 0.63 |

As can be seen from FIG. 16, the LED structure can be designed to have an IQE at a desired current injection density within a low to intermediate range by selected design parameters for IBLs that are incorporated within the active region of a monochromatic LED structure. The embodiment of FIG. 16 is particularly advantageous in applications in which an array of micro-scale solid state light emitters is used as emissive pixels of a display, herein referred to as emissive micro-scale solid state light display. In such an application, the entire emissive aperture of the device is also its optical aperture, and the device can therefore operate at a rather high optical coupling efficiency and thus would not typically require the use of high current injection density. In contrast, typical solid state light applications generally require the use of rather high current injection density. Emissive micro-scale solid state light displays would typically operate a low current injection regime in comparison with typical solid state light applications which generally operate a high current injection regime. For such low injection regime, the solid state micro-scale emitters IQE can be designed at their typical current injection operating point in order to preserve and further increase their operational efficiency. In another embodiment, the embodiment of FIG. 16 is used to design the IQE of emissive micro-scale solid state light displays in order to increase their operational efficiency.

According to the methods and structures described herein, and particularly by incorporating IBLs within the active region of a multi-color solid state light emitting structure, it is possible to provide a variable-color emission (or tunable) solid state light emitting material and variable-color emission (or tunable) solid state light emitting devices. As discussed above, there are numerous fields of application for such variable-color emission (or tunable) solid state light emitting materials and devices, including general lighting and display applications. As one example, the variable-color emission (or tunable) solid state light emitting materials and devices disclosed herein is in the field of emissive micro-scale solid state light display described in U.S. Pat. Nos. 7,623,560, 7,767,479, 7,829,902, 8,049,231 and 8,098,265 and U.S. Patent Publication Nos. 2010/0066921 and 2012/0033113, the contents of each of which are incorporated herein by reference. In this type of display, micro-scale pixel multi-color emission is realized by stacking multiple layers of state light emitting structures on top of a controlling silicon based complementary metal oxide semiconductor (CMOS) structure to form an individually addressable (in color and intensity) emissive micro-pixel array device. One advantage of such emissive micro-scale solid state light display technology is that it can be used to realize small pixel size in the range of few microns. How small the pixel pitch of such an emissive micro-scale solid state light display can be made is dependent upon the number electrical contacts needed to control emission color and intensity of each micro-scale pixel. In the case when three color primaries are used to create the display gamut, beside the one common contact for the entire micro-pixel array, at least three contacts are required per each emissive micro-scale pixel, which based on current semiconductor equipment capabilities allows the realization of a micro-scale pixel pitch in the range of approximately 10 microns. When the variable-color emission (or tunable) solid state light emitting material disclosed herein is used in the context of this type of emissive micro-scale solid state light display, beside the one common contact for the entire micro-pixel array, only one contact per micro-scale pixel is needed to control each pixel light emission. This reduction in the number of required contacts per micro-pixel makes it advantageously possible to realize an emissive multi-color micro-scale pixel pitch of 5 microns or less. In addition, when the variable-color emission (or tunable) solid state light emitting material disclosed herein is used in the context of this type of emissive micro-scale solid state light display, only one solid state light emitting layer is needed to realize a multi-color emissive micro-scale pixel display (instead of the typical three layers), which in turn will substantially reduce the manufacturing cost of the display.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the disclosure herein, aspects of which are defined in the claims.

What is claimed is:

1. A multi-layer semiconductor multi-color light emitting structure comprising:
   an optically active multi-layer region interposed between a pair of oppositely n-doped and p-doped peripheral layers comprising:
   a multiplicity of quantum confinement structures each comprising an active layer interposed between two barrier layers and each having different band-gaps to enable light emission of different wavelengths; and
   a multiplicity of intermediate carrier blocking layers interposed between the multiplicity of quantum confinement structures, each having:
   a predetermined band-gap and a band-offset, conduction and valence band energies that are respectively offset higher and lower than the peripheral layers' or the barrier layers' respective band energy,
   a different band-gap with respect to each other, and
   a wider band-gap than a band-gap of the peripheral layers or the barrier layers;
   wherein the band offsets and band-gaps of the intermediate carrier blocking layers are configured to provide controllable and tunable multi-color light emission matching a predetermined color spectral emission gamut.

2. The multi-layer semiconductor multi-color light emitting structure of claim 1 wherein a material composition of the intermediate carrier blocking layers and their dopant types and levels are selected to achieve a specified current dependent multi-color light emission spectral locus across the predetermined color spectral emission gamut.

3. The multi-layer semiconductor multi-color light emitting structure of claim 1 wherein the band-gaps of the quantum confinement structures as determined by their respective material composition are selected to enable light emission at color coordinates of a multiplicity of color primaries that define the predetermined color spectral emission gamut.

4. The multi-layer semiconductor multi-color light emitting structure of claim 1 wherein placement of the multiplicity of the quantum confinement structures within the optically active multi-layer region is selected such that a quantum confinement structure having a narrowest band-gap corresponding with a longest light emission wavelength is placed adjacent to the p-doped peripheral layer of claim 1 and a quantum confinement structure having a widest band-gap corresponding with a shortest light emission wavelength is placed adjacent to the n-doped peripheral layer of claim 1.

5. The multi-layer semiconductor multi-color light emitting structure of claim 1, wherein the multiplicity of intermediate carrier blocking layers are interposed between sub-regions of the optically active multi-layer region, wherein at least one of the sub-regions of the optically active multi-layer region comprises the multiplicity of quantum confinement structures, and wherein a number of the multiplicity of quantum confinement structures within such active sub-regions are selected to enable light emission at color primaries of the predetermined color spectral emission gamut.

6. The multi-layer semiconductor multi-color light emitting structure of claim 5 wherein the different band-gap and band-gap offset of each of the multiplicity of intermediate carrier blocking layers is selected to create a specified carrier injection current dependent selective injection profile into the quantum confinement structures or the sub-regions, and wherein a carrier injection selectivity defines a specified ratio of the carrier injection current into each of the multiplicity of quantum confinement structures or sub-regions relative to a total carrier injection current into the multi-layer semiconductor multi-color light emitting structure that defines a light emission color mixing ratio and multi-color emission spectral locus associated with the current dependent selective injection profile.

7. The multi-layer semiconductor multi-color light emitting structure of claim 6, wherein the carrier injection current dependent multi-color emission spectral locus associated with the current dependent selective injection profile is based on selecting: (1) the band-gaps of the multiplicity of quantum confinement structures comprising the optically active multi-layer region; (2) a number of the multiplicity of intermediate carrier blocking layers being incorporated into the optically active multi-layer region; (3) a specific placement position of each of the multiplicity of intermediate carrier blocking layers within the optically active multi-layer region; (4) the different band-gap of each of the multiplicity of intermediate carrier blocking layers as determined by their material composition; (5) the band-gap offsets as determined by the doping type and level of each of the multiplicity of intermediate carrier blocking layers; (6) the valence and conduction bands energy levels of each of the multiplicity of intermediate carrier blocking layers relative to the valence and conduction bands energy level of the barrier layers between which each of the multiplicity of intermediate carrier blocking layers is interposed; and (7) the valence and conduction bands energy levels of each of the multiplicity of intermediate carrier blocking layers relative to the valence and conduction bands energy level of the oppositely n-doped and p-doped peripheral layers.

8. The multi-layer semiconductor multi-color light emitting structure of claim 1 wherein an additional intermediate carrier blocking layer is placed in between the n-doped peripheral layer and a quantum confinement structure having a widest band-gap corresponding with the shortest light emission wavelength to enable controllable and tunable full coverage of the specified multi-color light emission gamut.

9. The multi-layer semiconductor multi-color light emitting structure of claim 1 wherein the multiplicity of intermediate carrier blocking layers interposed between the multiplicity of quantum confinement structures each have a predetermined band-gap and a band-offset to act as an intermediate strain compensation layer that minimizes a crystalline strain across the optically active multi-layer region.

10. The multi-layer semiconductor multi-color light emitting structure of claim 9, wherein the crystalline strain compensation aspects of the multiplicity of intermediate carrier blocking layers enable a higher Indium (In) intake within a nitride-based optically active layers to enable epitaxial growth of optically active layers having long wavelength light emission ranging from Amber, 615-nm, to Red, 625-nm, within the active multi-layer region of the multi-color light-emitting structure, which in turn enables a color-tunable nitride-based light emitting structure with multi-color light emission across the visible light spectral region.

* * * * *